(12) United States Patent
Yoshida

(10) Patent No.: US 11,170,725 B2
(45) Date of Patent: Nov. 9, 2021

(54) DISPLAY DEVICE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/850,068

(22) Filed: Apr. 16, 2020

(65) Prior Publication Data

US 2020/0335053 A1  Oct. 22, 2020

Related U.S. Application Data

(60) Provisional application No. 62/835,539, filed on Apr. 18, 2019.

(51) Int. Cl.

| *G09G 3/36* | (2006.01) |
|---|---|
| *H01L 27/12* | (2006.01) |
| *H01L 29/786* | (2006.01) |
| *G02F 1/1362* | (2006.01) |
| *G02F 1/1343* | (2006.01) |
| *G02F 1/1333* | (2006.01) |
| *G02F 1/1368* | (2006.01) |
| *G02F 1/1339* | (2006.01) |

(52) U.S. Cl.
CPC ......... *G09G 3/3648* (2013.01); *G02F 1/1368* (2013.01); *G02F 1/13394* (2013.01); *G02F 1/133345* (2013.01); *G02F 1/134309* (2013.01); *G02F 1/136227* (2013.01); *G02F 1/136286* (2013.01); *G09G 3/3674* (2013.01); *H01L 27/1225* (2013.01); *H01L 27/1244* (2013.01); *H01L 29/7869* (2013.01); *H01L 29/78633* (2013.01); *G02F 2201/121* (2013.01); *G09G 2300/0426* (2013.01); *G09G 2380/02* (2013.01)

(58) Field of Classification Search
CPC ................ G09G 3/3648; G09G 2300/0426
See application file for complete search history.

(56) References Cited

U.S. PATENT DOCUMENTS

| 2012/0113376 A1* | 5/2012 | Hayashi | G02F 1/13452 349/141 |
|---|---|---|---|
| 2019/0064561 A1* | 2/2019 | Shiina | G06F 3/0412 |
| 2019/0339555 A1 | 11/2019 | Yoshida | |

FOREIGN PATENT DOCUMENTS

WO   2018/128106 A1   7/2018

* cited by examiner

*Primary Examiner* — Kevin M Nguyen
(74) *Attorney, Agent, or Firm* — Keating & Bennett, LLP

(57) ABSTRACT

A display device includes: a plurality of pixel electrodes having a long shape and arranged at least in a long side direction of the plurality of pixel electrodes; a common electrode overlapping the plurality of pixel electrodes with an insulating film interposed therebetween; an image wiring line extending in a short side direction of the plurality of pixel electrodes, arranged such that two of the image wiring lines are sandwiched between two pixel electrodes of the plurality of pixel electrodes, and supplying an image signal to each of the two pixel electrodes; and a common wiring line extending in the short side direction, arranged to sandwich one of the plurality of pixel electrodes together with the image wiring line in the long side direction, connected to the common electrode, and including a portion formed of a portion of the same conductive film as the image wiring line.

15 Claims, 18 Drawing Sheets

DISPLAY DEVICE

CROSS-REFERENCE TO RELATED APPLICATION

The present application claims priority to U.S. Provisional Application Ser. No. 62/835,539, filed Apr. 18, 2019, the content to which is hereby incorporated by reference into this application.

BACKGROUND OF THE INVENTION

Field of the Invention

The present invention relates to a display device.

Description of the Related Art

A display device described in PTL 1 below is known as an example of display devices of the prior art. The display device described in PTL 1 includes a curved liquid crystal panel. The curved liquid crystal panel includes: a pair of substrates, with a display surface curved around an axis of curvature, with plate surfaces arranged to face each other with an interval therebetween; a first TFT that is provided on an array substrate; a second TFT that is provided on the array substrate and is arranged to be adjacent to the first TFT in a curve direction that is orthogonal to the axis of the curvature and that is along the display surface; a spacer part arranged to overlap at least one of the first TFT and the second TFT adjacent to each other, the spacer part being provided on a CF substrate and maintaining an interval between the pair of substrates by coming into contact with the array substrate.

CITATION LIST

Patent Literature

PTL 1: WO 2018/128106

SUMMARY OF INVENTION

The curved liquid crystal panel described in PTL 1 described above includes, in addition to the above-described configuration, gate wiring lines connected to each of the TFTs; source wiring lines connected to each of the TFTs; pixel electrodes connected to each of the TFTs; common electrodes arranged to overlap the pixel electrodes; and light blocking portions that are conductively connected to the common electrodes. Among those, the light blocking portions are formed of a metal film layered on a transparent electrode film constituting the common electrodes on an upper layer side. Thus, in the curved liquid crystal panel described in PTL 1, since the gate wiring lines, the source wiring lines, and the light blocking portions are formed of three different metal films, there are problems that each of the metal films needs to be deposited and to be patterned to obtain a predetermined planar pattern, accordingly many manufacturing devices are needed, and the like.

The present invention has been completed on the basis of the circumstances described above, and an objective of the present invention is to reduce the number of conductive films.

(1) An embodiment of the present invention is a display device including: a plurality of pixel electrodes having a long shape and arranged at least in a long side direction of the plurality of pixel electrodes; a common electrode overlapping the plurality of pixel electrodes with an insulating film interposed between the common electrode and the plurality of pixel electrodes; an image wiring line extending in a short side direction of the plurality of pixel electrodes, arranged such that two of the image wiring lines are sandwiched between two pixel electrodes of the plurality of pixel electrodes adjacent to each other in the long side direction, and supplying an image signal to each of the two pixel electrodes adjacent to each other in the long side direction; and a common wiring line extending in the short side direction, arranged to sandwich one of the two pixel electrodes of the plurality of pixel electrodes together with the image wiring line in the long side direction, connected to the common electrode, and including a portion formed of a portion of the same conductive film as the image wiring line.

(2) In addition, another embodiment of the present invention is, in addition to the configuration of (1) described above, the display device including a scanning wiring line arranged adjacent to the plurality of pixel electrodes in the short side direction and extending in the long side direction, in which the common wiring line and the common electrode are arranged to overlap each other with an insulating film interposed between the common wiring line and the common electrode and are connected through a common wiring line contact hole formed at a position in the insulating film overlapping the scanning wiring line.

(3) In addition, another embodiment of the present invention is, in addition to the configuration of (1) or (2) described above, the display device including: a scanning wiring line arranged adjacent to the plurality of pixel electrodes in the short side direction and extending in the long side direction; and a switching element connected to a pixel electrode of the plurality of pixel electrodes, the image wiring line, and the scanning wiring line, in which the switching element includes a first gate electrode connected to the scanning wiring line, a channel region formed of a semiconductor film and arranged to overlap the first gate electrode on an upper layer side with a first gate insulating film between the channel region and the first gate electrode, a second gate electrode arranged to overlap the channel region on the upper layer side with a second gate insulating film interposed between the second gate electrode and the channel region and connected to the first gate electrode, a source region connected to one end side portion of the channel region and the image wiring line, and a drain region connected to the other end side portion of the channel region and the pixel electrode.

(4) In addition, another embodiment of the present invention is, in addition to the configuration of (3) described above, the display device in which the scanning wiring line includes a first scanning wiring line formed of a portion of the same conductive film as the first gate electrode and continuous with the first gate electrode and a second scanning wiring line formed of a portion of the same conductive film as the second gate electrode, continuous with the second gate electrode, and connected to the first scanning wiring line.

(5) In addition, another embodiment of the present invention is, in addition to the configuration of (4) described above, the display device in which the first scanning wiring line and the second scanning wiring line are arranged to at least partially overlap each other with an insulating film interposed between the first scanning wiring line and the second scanning wiring line.

(6) In addition, another embodiment of the present invention is, in addition to the configuration of (5) described above, the display device in which the first scanning wiring line and the second scanning wiring line are connected through a scanning wiring line contact hole formed in the insulating film interposed at an overlapping portion at which the first scanning wiring line and the second scanning wiring line overlap and at a position in the long side direction of the overlapping portion between pixel electrodes of the plurality of pixel electrodes adjacent to each other and sandwiching the common wiring line.

(7) In addition, another embodiment of the present invention is, in addition to any one of the configurations of (4) to (6) described above, the display device in which, in comparison to the first scanning wiring line, while a portion of the second scanning wiring line adjacent to the plurality of pixel electrode is narrower, a portion of the second scanning wiring line adjacent to the switching element is wider.

(8) In addition, another embodiment of the present invention is, in addition to any one of the configurations of (1) to (7) described above, the display device including: a switching element connected at least to one of the plurality of pixel electrodes and the image wiring line and including at least a channel region formed of a portion of a semiconductor film, in which the common wiring line includes a main wiring section formed of a portion of the same conductive film as the image wiring line and a sub-wiring section arranged to overlap the main wiring section, connected to the main wiring section, and formed of a portion of the semiconductor film formed having low resistance at the portion different from the channel region.

(9) In addition, another embodiment of the present invention is, in addition to the configuration of (8) described above, the display device in which the switching element includes at least a gate electrode arranged to overlap the channel region on an upper layer side with a gate insulating film interposed between the channel region and the gate electrode and a scanning wiring line arranged adjacent to the plurality of pixel electrodes in the short side direction, extending in the long side direction, including a portion formed of a portion of the same conductive film as the gate electrode, and continuous with the gate electrode, and the common wiring line is arranged such that the main wiring section and the sub-wiring section overlap each other with an insulating film interposed between the main wiring section and the sub-wiring section and are connected through wiring section contact holes formed in the insulating film interposed at at least two positions at which the scanning wiring line is sandwiched in the short side direction.

(10) In addition, another embodiment of the present invention is, in addition to any one of the configurations of (1) to (9) described above, the display device including: a first substrate provided with at least the plurality of pixel electrodes, the common electrode, the image wiring line, and the common wiring line; a second substrate arranged to face the first substrate with an interval between the first substrate and the second substrate; and
a spacer part provided on the second substrate and maintaining an interval with the first substrate by being interposed between the first substrate and the second substrate, in which the spacer part is arranged such that the spacer part overlaps at least one of two of the image wiring lines sandwiched between the two of the plurality of pixel electrodes adjacent to each other in the long side direction.

(11) In addition, another embodiment of the present invention is, in addition to the configuration of (10) described above, the display device in which the first substrate and the second substrate are formed such that a plate surface of the first substrate and the second substrate curves around at least one axis of curvature and a curve direction thereof coincides with the long side direction.

(12) In addition, another embodiment of the present invention is, in addition to the configuration of (10) or (11) described above, the display device including a scanning wiring line arranged adjacent to the plurality of pixel electrodes in the short side direction and extending in the long side direction, in which the spacer part is arranged to overlap the scanning wiring line.

(13) In addition, another embodiment of the present invention is, in addition to any one of the configurations of (10) to (12) described above, the display device including: a switching element connected at least to one of the plurality of pixel electrodes and the image wiring line and including at least a channel region formed of a portion of a semiconductor film; a channel region overlapping portion formed of a portion of the same conductive film as the image wiring lines, arranged on the same straight line on which the spacer part is located in the long side direction, and arranged to overlap the channel region; and an image wiring line overlapping portion formed of a portion of the semiconductor film different from the channel region, arranged on the same straight line on which the spacer part is located in the long side direction, and arranged to overlap the image wiring line.

According to one aspect of the present invention, the number of conductive films can be reduced.

DESCRIPTION OF EMBODIMENTS

First Embodiment

The first embodiment of the present invention will be described with reference to FIG. 1 to FIG. 12. In the present embodiment, a liquid crystal display device 10 is illustrated. Note that the X axis, the Y axis, and the Z axis are illustrated in a part of each drawing, and each axial direction is illustrated to be the direction illustrated in each drawing. In addition, the upper sides of FIG. 4, FIG. 5, FIG. 8, FIG. 9, FIG. 11, and FIG. 12 are assumed to be front sides, and the lower sides of the same drawings are assumed to be back sides.

Figure 1:
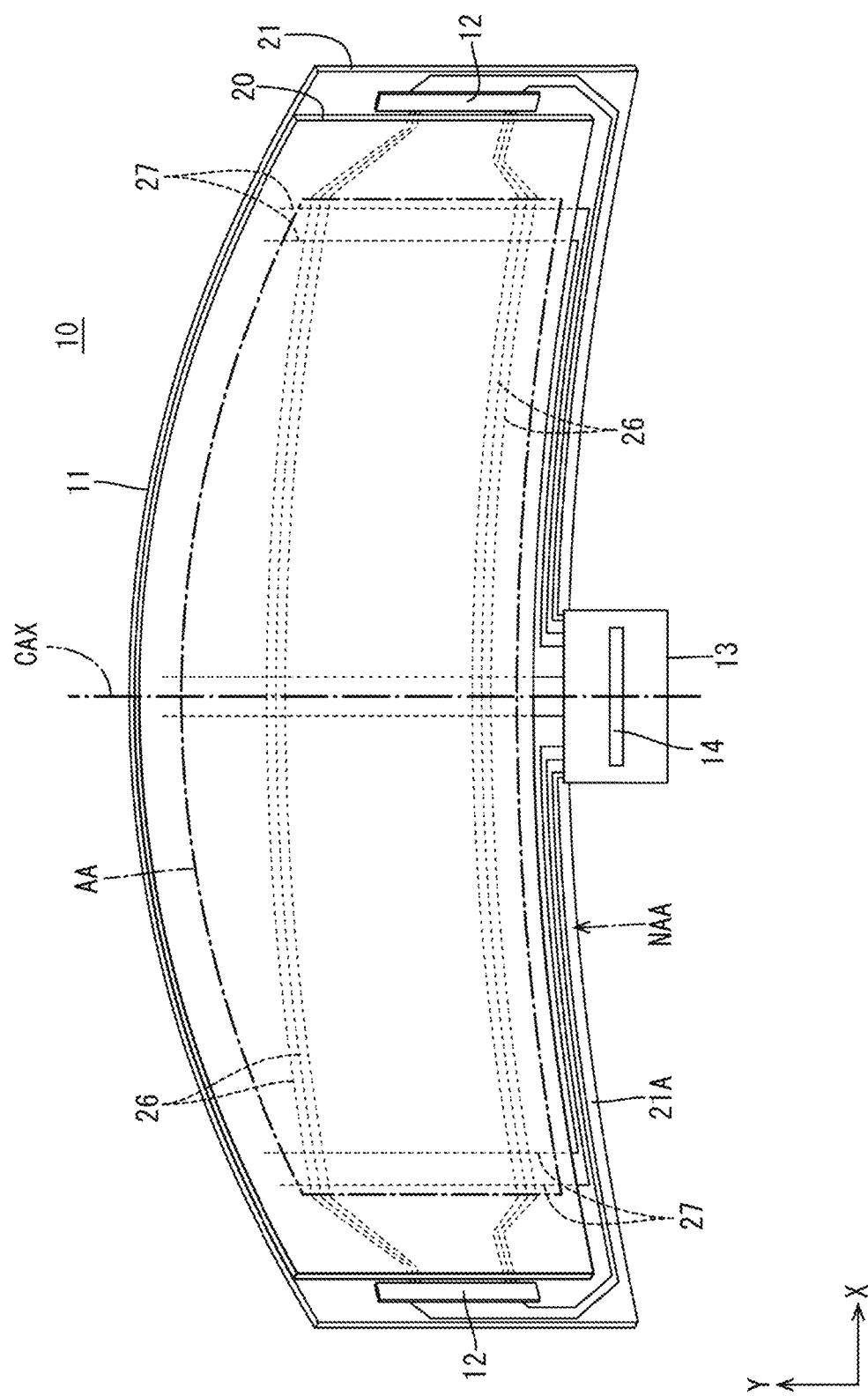
FIG. 1 is a schematic perspective view of a liquid crystal panel provided in a liquid crystal display device according to a first embodiment of the present invention.

FIG. 1 is a schematic perspective view of a liquid crystal panel 11. As illustrated in FIG. 1, the liquid crystal display device 10 includes: at least a liquid crystal panel (a display panel or a display device) 11 having a horizontally long shape as a whole; and a backlight device (an illumination device) that is an external light source that emits light for use in a display on the liquid crystal panel 11. The liquid crystal panel 11 is curved in substantially an arc shape in which the center part of the liquid crystal panel in a long side direction protrudes to the back side and both ends of the liquid crystal panel in a long side direction recede to the front side, and a cross-sectional shape is substantially C-shaped. In the liquid crystal panel 11, a short side direction coincides with a Y axis direction in each drawing, and the long side direction coincides with an X axis direction in each drawing, and a plate thickness direction (the normal direction of a plate surface of the liquid crystal panel 11) coincides with a Z axis direction in each drawing. In the axis of curvature CAX of the liquid crystal panel 11, the axial direction (the curve orthogonal direction) of the liquid crystal panel 11 coincides with the short side direction (the Y axis direction), and the curve direction that is orthogonal to the axis of curvature CAX and that is along the plate surface of the liquid crystal panel 11 (the direction in which the curvature of the plate surface changes) coincides with the long side direction (the X axis direction) of the liquid crystal panel 11. In the liquid crystal panel 11, while a pair of side parts on the short side have a straight-line shape parallel to the Y axis direction and while one side part on the long side has a straight-line shape parallel to the X axis direction, the remaining side part on the long side is curved in an arc shape in a plan view and is formed in a substantially semi-cylindrical planar shape as a whole. Note that the backlight device is preferably formed in a curved shape in a manner that follows the liquid crystal panel 11 but is not necessarily limited to that shape.

As illustrated in FIG. 1, the liquid crystal panel 11 has a center portion on the screen that is set as a display region (a range surrounded by a dot-dashed line in FIG. 1) AA in which images are displayed. In contrast, a frame-shaped outer peripheral part surrounding the display region AA on the screen of the liquid crystal panel 11 is set as a non-display region NAA in which no images are displayed. The liquid crystal panel 11 is formed by bonding a pair of substrates 20 and 21. The front side (front surface side) substrate of the pair of substrates 20 and 21 is set as a CF substrate (a second substrate or a counter substrate) 20, and a back side (back surface side) substrate thereof is set as an array substrate (a first substrate or an active matrix substrate) 21. Both the CF substrate 20 and the array substrate 21 are formed by layering various films on an inner surface side of the glass substrate. Note that polarizers are attached to the outer surface sides of both the substrates 20 and 21, respectively.

The CF substrate 20 has a short side dimension and a long side dimension that are shorter, respectively, than the short side dimension and the long side dimension of the array substrate 21, as illustrated in FIG. 1. In addition, the CF substrate 20 is bonded to the array substrate 21 with the center position aligned with the array substrate 21 in the long side direction, while only one side (arc-shaped curved side) is aligned with the array substrate 21 in the short side direction (the Y axis direction). Accordingly, the array substrate 21 has a CF substrate non-overlapping portion 21A formed such that three sides excluding one side in the short side direction protrude laterally with respect to the CF substrate 20 and thus do not overlap the CF substrate 20. A gate driver 12 and a flexible substrate (a signal transmission part) 13 are mounted on the CF substrate non-overlapping portion 21A. The gate driver 12 is formed of an LSI chip having a drive circuit therein, is mounted on the array substrate 21 by means of Chip-On-Glass (COG), and supplies scanning signals to the display region AA based on signals transmitted by the flexible substrate 13. In the present embodiment, the gate driver 12 is mounted on each of the pair of short side portions of the CF substrate non-overlapping portion 21A. The flexible substrate 13 is mounted on the long side portion of the CF substrate non-overlapping portion 21A by means of Chip-On-Board (COB). A source driver 14 is mounted to the flexible substrate 13 by means of Chip-On-Film (COF). The source driver 14 is formed of an LSI chip having a drive circuit therein, processes various signals supplied via the flexible substrate 13, and supplies image signals to the display region AA via the flexible substrate 13. In the present embodiment, only one source driver 14 is mounted on the flexible substrate 13. The flexible substrate 13 has a configuration in which a plurality of wiring patterns are formed on a substrate made from a synthetic resin material having insulating properties and flexibility (for example, a polyimide-based resin, or the like). One end of the flexible substrate 13 is connected to the non-display region NAA of the liquid crystal panel 11, and the other end thereof is connected to a control substrate (a signal supply source), respectively.

Figure 2:
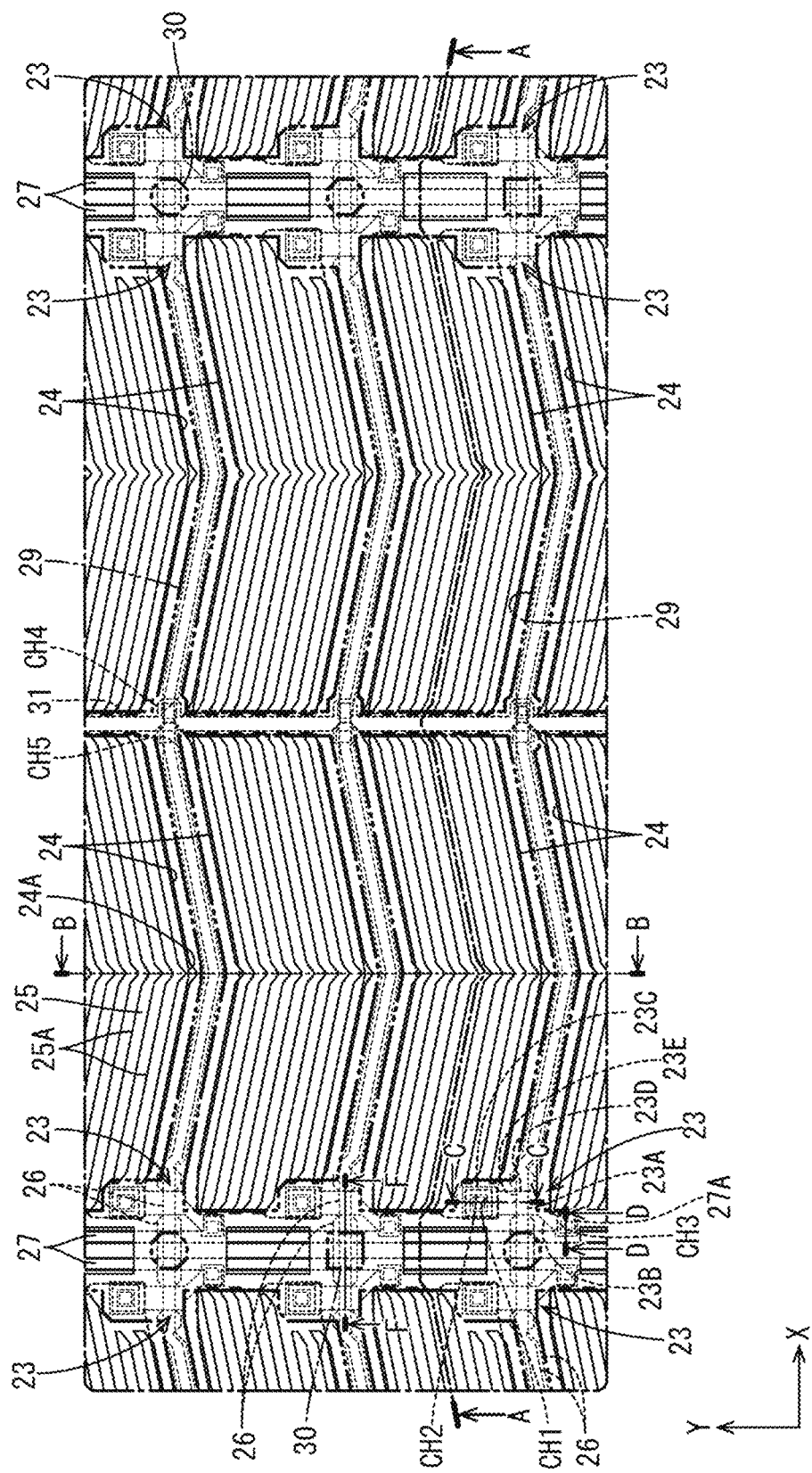
FIG. 2 is a plan view illustrating a pixel array of the liquid crystal panel.

FIG. 2 is a plan view of the display region AA of the array substrate 21 and the CF substrate 20 constituting the liquid crystal panel 11. As illustrated in FIG. 2, TFTs (switching elements or thin film transistors) 23 and pixel electrodes 24 are provided on an inner surface side of the display region AA of the array substrate 21 constituting the liquid crystal panel 11. The pixel electrodes 24 are provided in a matrix shape side by side with a plurality of intervals in the X axis direction and the Y axis direction. Gate wiring lines (scanning wiring lines) 26 and source wiring lines (image wiring lines, signal wiring lines, or data wiring lines) 27 that are orthogonal to (intersect) each other are disposed around the pixel electrodes 24. While the gate wiring lines 26 extend approximately in the X axis direction, the source wiring lines 27 extend approximately in the Y axis direction. The TFTs 23 are connected to each of the pixel electrodes 24, the gate wiring lines 26, and the source wiring lines 27. The TFTs 23 are driven based on various signals supplied to each of the gate wiring lines 26 and the source wiring lines 27, and the supply of potential to the pixel electrodes 24 is controlled along with the driving.

The pixel electrodes 24 have a horizontally long shape in a plan view, having a long side direction coinciding with the X axis direction and a short side direction coinciding with the Y axis direction as illustrated in FIG. 2. The proportion of a long side dimension to a short side dimension of each pixel electrode 24 is 3. Each pixel electrode 24 has a bent planar shape with a bent portion 24A halfway in the long side direction. Specifically, the pixel electrode 24 has a shallow V shape in which both side edges on the long side are inclined slightly in the X axis direction and bent once approximately at the center portion to have an obtuse angle at the vertex. The pixel electrode 24 has the bent portion 24A at approximately the center position in the long side direction and has a planar shape in which two parallelograms are connected to be approximately symmetric with respect to a virtual center line extending in the short side direction through the bent portion 24A. The bent portion 24A is located at the seam of the two parallelograms described above and has a straight line shape connecting bending points at both side edges of the pixel electrode 24 in the short side direction of the pixel electrode 24.

As illustrated in FIG. 2, the pixel electrodes 24 are arranged to repeatedly alternate with the gate wiring lines 26 one by one in the short side direction (the Y axis direction) of the pixel electrode 24. Thus, one gate wiring line 26 is interposed between the pixel electrodes 24 adjacent to each other in the Y axis direction, and one pixel electrode 24 is interposed between the gate wiring lines 26 adjacent to each other in the Y axis direction. Each of the gate wiring lines 26 adjacent to the pixel electrode 24 in the short side direction is parallel to the long side edge of the pixel electrode 24 and is repeatedly bent in a zigzag manner along the long side edge of each pixel electrode 24. The number of pixel electrodes 24 arranged in the Y axis direction coincides with the number of gate wiring lines 26 installed. On the other hand, the pixel electrodes 24 are arranged to repeatedly alternate with the source wiring lines 27 two by two in the long side direction (the X axis direction) of the pixel electrode 24. Thus, a source wiring line disposition region in which two source wiring lines 27 are interposed and a non-source wiring line disposition region in which no source wiring line 27 is disposed are arranged repeatedly in an alternating manner between pixel electrodes 24 adjacent to each other in the X axis direction. Two source wiring lines 27 disposed in each source wiring line disposition region are arranged at a predetermined interval in the X axis direction to avoid short-circuiting between them. Since the two source wiring lines 27 are disposed in the source wiring line disposition region as described above, the dimension thereof in the X axis direction is larger than that of the non-source wiring line disposition region in which no source wiring lines 27 are disposed. The number of pixel electrodes 24 arranged in the X axis direction coincides with the number of source wiring lines 27 installed. Note that, while the gate wiring lines 26 intersect (overlap) all of the source wiring lines 27 arranged in the X axis direction, the source wiring lines 27 intersect all of the gate wiring lines 26 arranged in the Y axis direction.

As illustrated in FIG. 2, the TFTs 23 are disposed in a region at or near the intersections of the gate wiring lines 26 and the source wiring lines 27. Specifically, each of the TFTs 23 is disposed to be adjacent to a pixel electrode 24 side to be connected in the X axis direction to every two source wiring lines 27 arranged in a source wiring line disposition region. Thus, every two TFTs 23 are arranged to be sandwiched between two pixel electrodes 24 sandwiching two source wiring lines 27 and are not disposed at or near a non-source wiring line disposition region. These every two TFTs 23 are capable of supplying image signals supplied from every two adjacent source wiring lines 27 to the pixel electrodes 24. As described above, since each pixel electrode 24 has a horizontally long shape, when compared to a case in which the pixel electrode has a vertically long shape, while the number of source wiring lines 27 installed per unit length in the X axis direction is approximately the proportion obtained by dividing the short side dimension of the pixel electrode 24 by the long side dimension thereof (for example, approximately ⅓), the number of gate wiring lines 26 installed is approximately the proportion obtained by dividing the long side dimension of the pixel electrode 24 by the short side dimension (for example, approximately 3). As a result, since the number of source wiring lines 27 installed can be reduced, the number of image signals supplied to the source wiring lines 27 is reduced. On the other hand, since the number of gate wiring lines 26 installed increases, a drive time of the TFTs 23 driven by signals transmitted to the gate wiring lines 26 tends to be short and a charging time of the pixel electrodes 24 tends to be short.

Common electrodes 25 are formed on an upper layer side of each pixel electrode 24 such that the common electrodes overlap all of the pixel electrodes 24, as illustrated in FIG. 2, on the inner surface side of the display region AA of the array substrate 21. The common electrodes 25 is configured to be supplied with a substantially constant common potential (reference potential) at all times and extend across substantially the entire display region AA. A plurality of pixel overlap openings (pixel overlap slits or alignment control slits) 25A that extend in the long side direction of each pixel electrode 24 are formed in a portion of common electrode 25 overlapping each pixel electrode 24. Note that the specific number installed, the shape, and the formation range of the pixel overlap opening 25A and the like can be changed from the illustrated configuration as appropriate. When a potential difference arises between a pixel electrode 24 and a common electrode 25 overlapping each other as the pixel electrode 24 is charged, a fringe electric field (oblique electric field) including a component in a direction normal to the plate surface of the array substrate 21 is generated, in addition to components along the plate surface of the array substrate 21, between the opening edge of the pixel overlap opening 25A and the pixel electrode 24. Thus, by using this fringe electric field, an alignment state of liquid crystal molecules included in a liquid crystal layer 22 can be controlled. In other words, the liquid crystal panel 11 according to the present embodiment has an operation mode of a Fringe Field Switching (FFS) mode. Furthermore, a common wiring line 31 for supplying a common potential to the common electrode 25 is provided on the inner surface side of the display region AA of the array substrate 21. A detailed configuration of the common wiring line 31 will be described again below.

Figure 3:
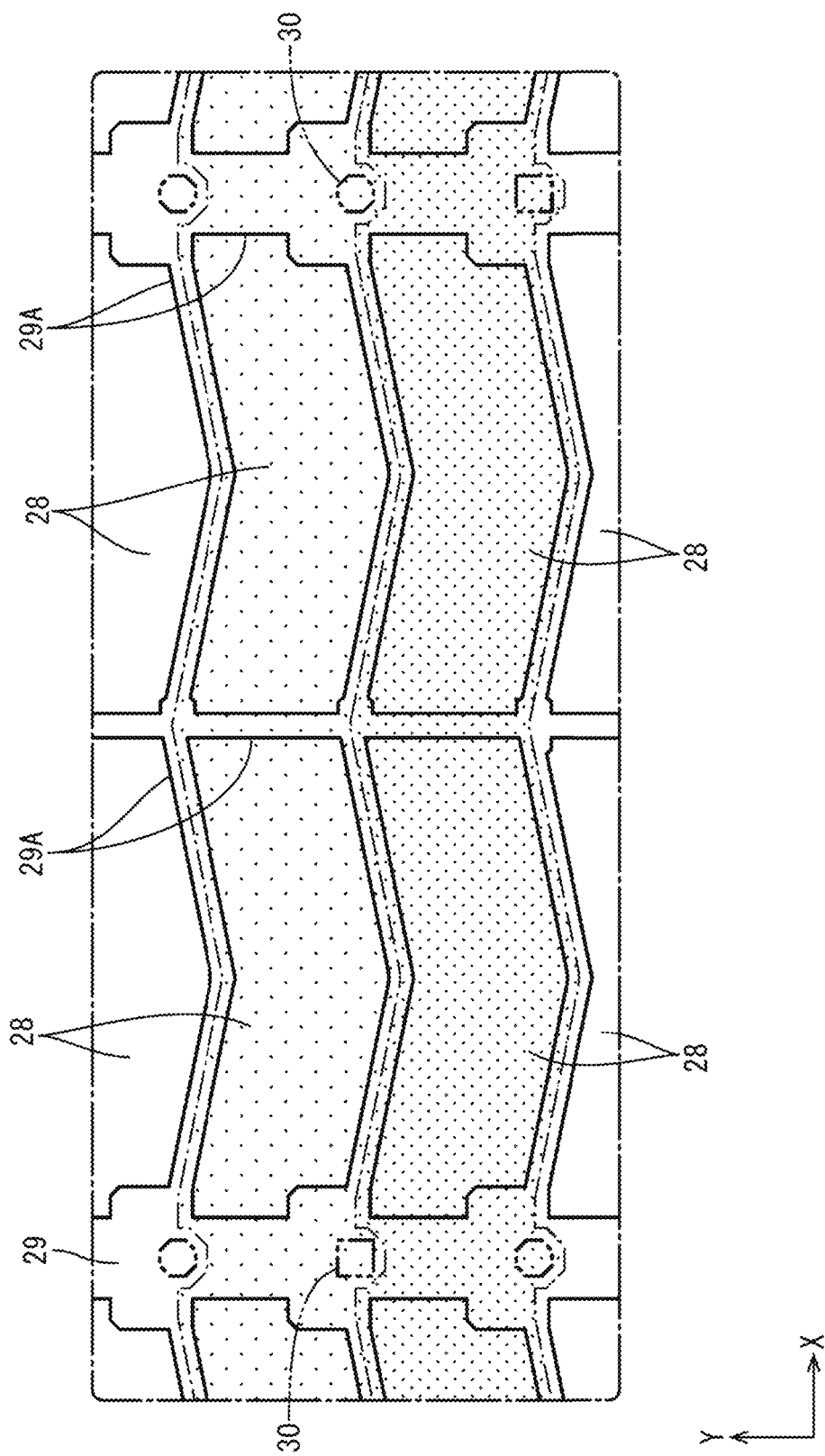
FIG. 3 is a plan view illustrating a pixel array on a CF substrate constituting the liquid crystal panel.

FIG. 3 is a plan view of the display region AA of the CF substrate 20 constituting the liquid crystal panel 11. As illustrated in FIG. 3, color filters 28 that exhibits three colors of blue (B), green (G), and red (R) are provided in the display region AA on the inner surface side of the CF substrate 20. The plurality of color filters 28 are arranged side by side in the X axis direction and the Y axis direction in a matrix shape and overlap the pixel electrodes 24 on the array substrate 21 side in a plan view. Among the color filters 28, those exhibiting different colors are repeatedly arranged along the source wiring lines 27 (Y axis direction), and those exhibiting the same color are arranged continuously along the gate wiring lines 26 (X axis direction). Black matrices 29 are disposed to partition the adjacent color filters 28. Each of the black matrices 29 has substantially a lattice shape in a planar shape and includes a pixel opening 29A at a position overlapping a large portion of the pixel electrode 24 in a plan view. The pixel opening 29A allows transmitted light of the pixel electrode 24 to be emitted to the outside of the liquid crystal panel 11. The black matrices 29 are disposed to overlap at least the TFTs 23, the gate wiring lines 26, the source wiring lines 27 (common wiring lines 31 that will be described below), and the like on the array substrate 21 side in a plan view. On the CF substrate 20, spacer parts 30 for maintaining an interval between the pair of substrates 20 and 21 are provided at positions overlapping portions of the black matrices 29. Detailed disposition of the spacer parts 30 and the like will be described again.

Figure 4:
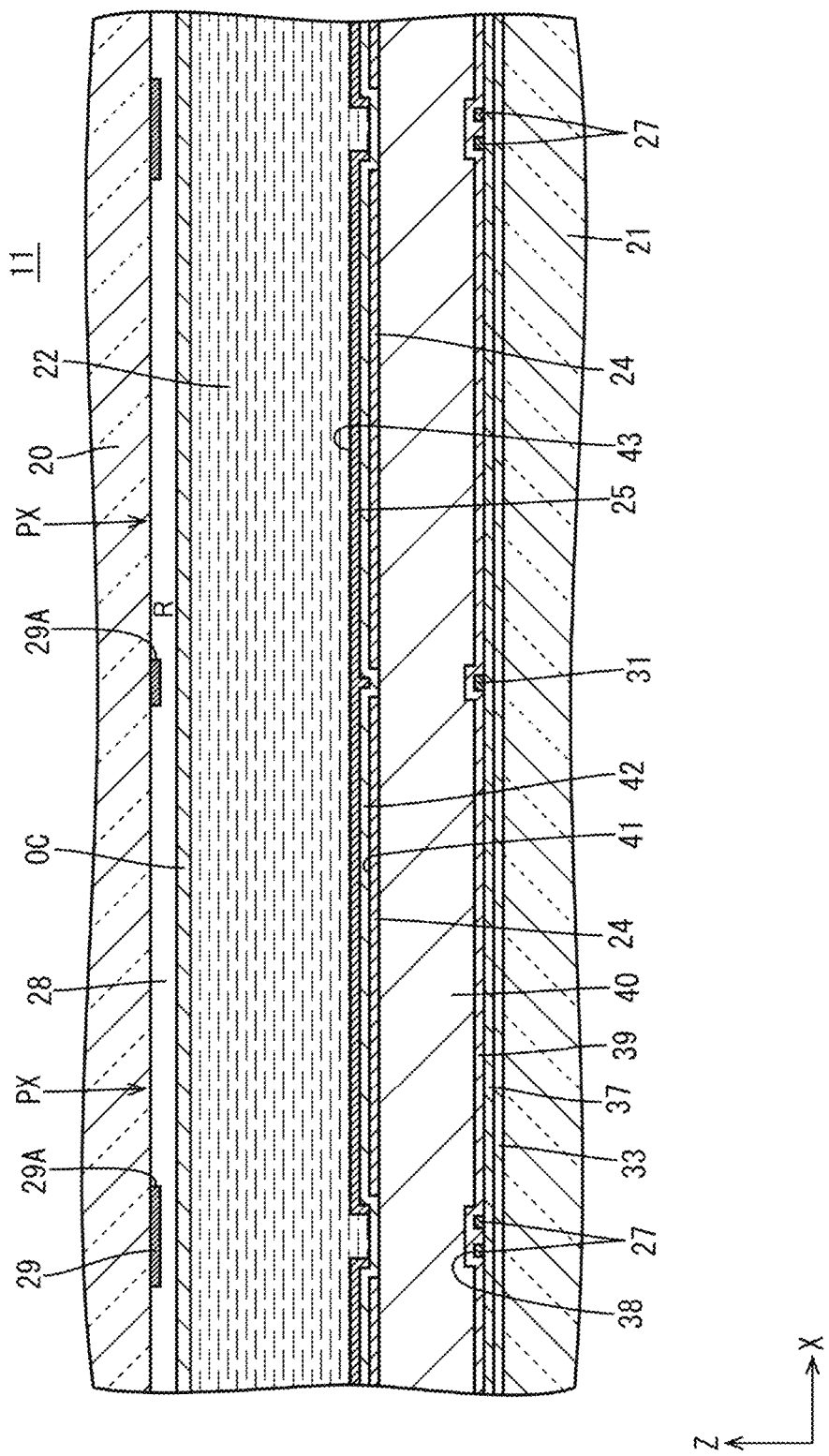
FIG. 4 is a cross-sectional view of the liquid crystal panel along the line A-A of FIG. 2.
Figure 5:
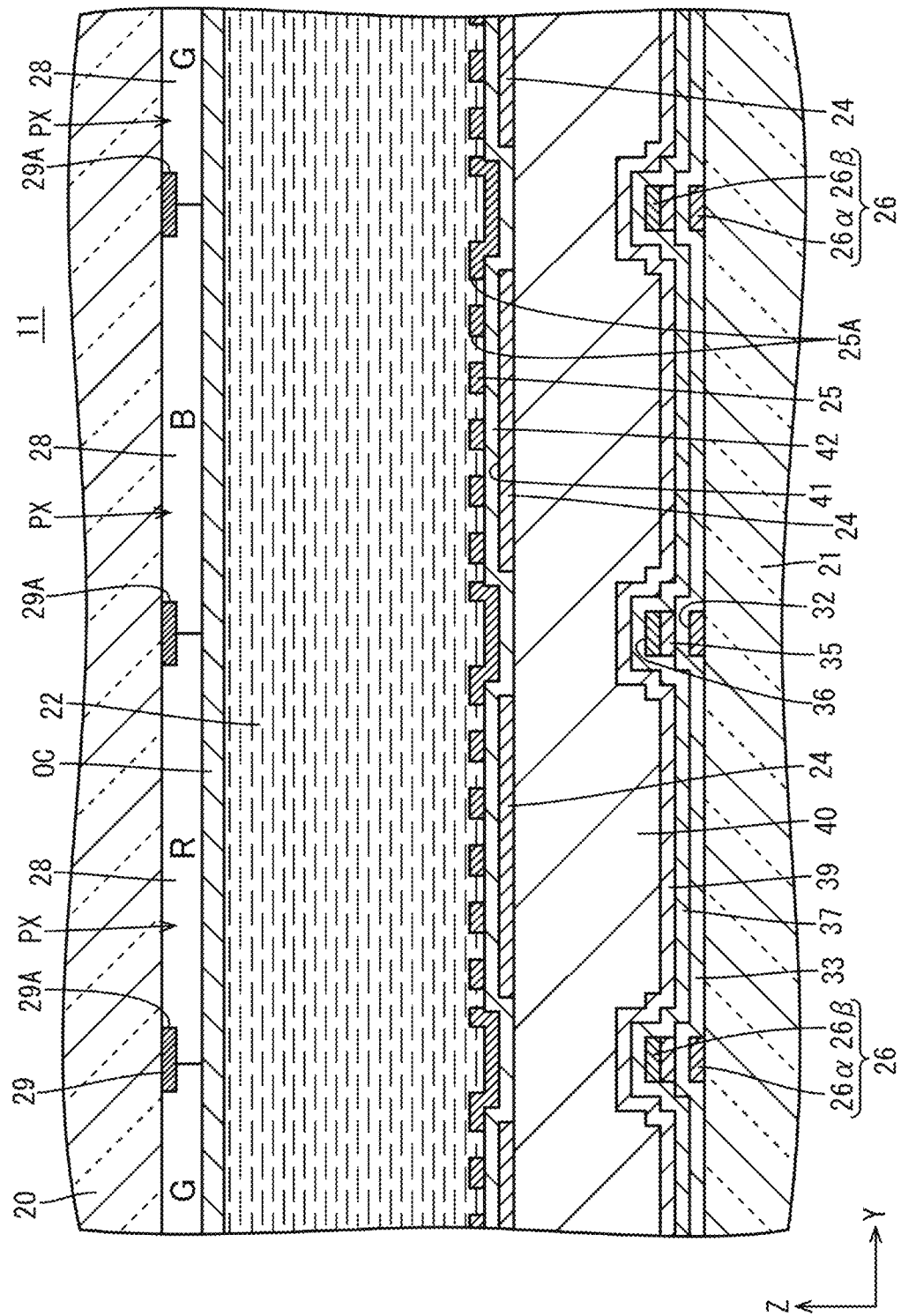
FIG. 5 is a cross-sectional view of the liquid crystal panel along the line B-B of FIG. 2.

FIG. 4 is a cross-sectional view of a pixel part PX of the liquid crystal panel 11 cut along the X axis direction. FIG. 5 is a cross-sectional view of the pixel part PX of the liquid crystal panel 11 cut along the Y axis direction. As illustrated in FIG. 4 and FIG. 5, the liquid crystal panel 11 includes the liquid crystal layer (medium layer) 22 including liquid crystal molecules disposed between the pair of substrates 20 and 21, optical properties of which change with the application of an electric field. The color filter 28 on the CF substrate 20 side and the pixel electrode 24 on the array substrate 21 side are disposed to face with the liquid crystal layer 22 interposed therebetween. In the liquid crystal panel 11, R, G, and B color filters 28 arranged in the Y axis direction and three pixel electrodes 24 facing each of the color filters 28 constitute pixel parts PX of three colors, respectively. In addition, the liquid crystal panel 11 includes display pixels configured to perform color display with a predetermined grayscale using the pixel parts PX of the three colors including R, G, and B adjacent to one another in the Y axis direction. An arrangement pitch of the pixel parts PX in the Y axis direction is, for example, approximately 60 μm, and an arrangement pitch thereof in the X axis direction is, for example, approximately 180 μm. In addition, a flattening film OC disposed in a solid shape over substantially the entire area of the CF substrate 20 is provided on the upper layer side (liquid crystal layer 22 side) of the color filters 28 on the CF substrate 20. Note that alignment films for aligning the liquid crystal molecules included in the liquid crystal layer 22 are formed on the innermost surfaces of both substrates 20 and 21 in contact with the liquid crystal layer 22.

Figure 6:
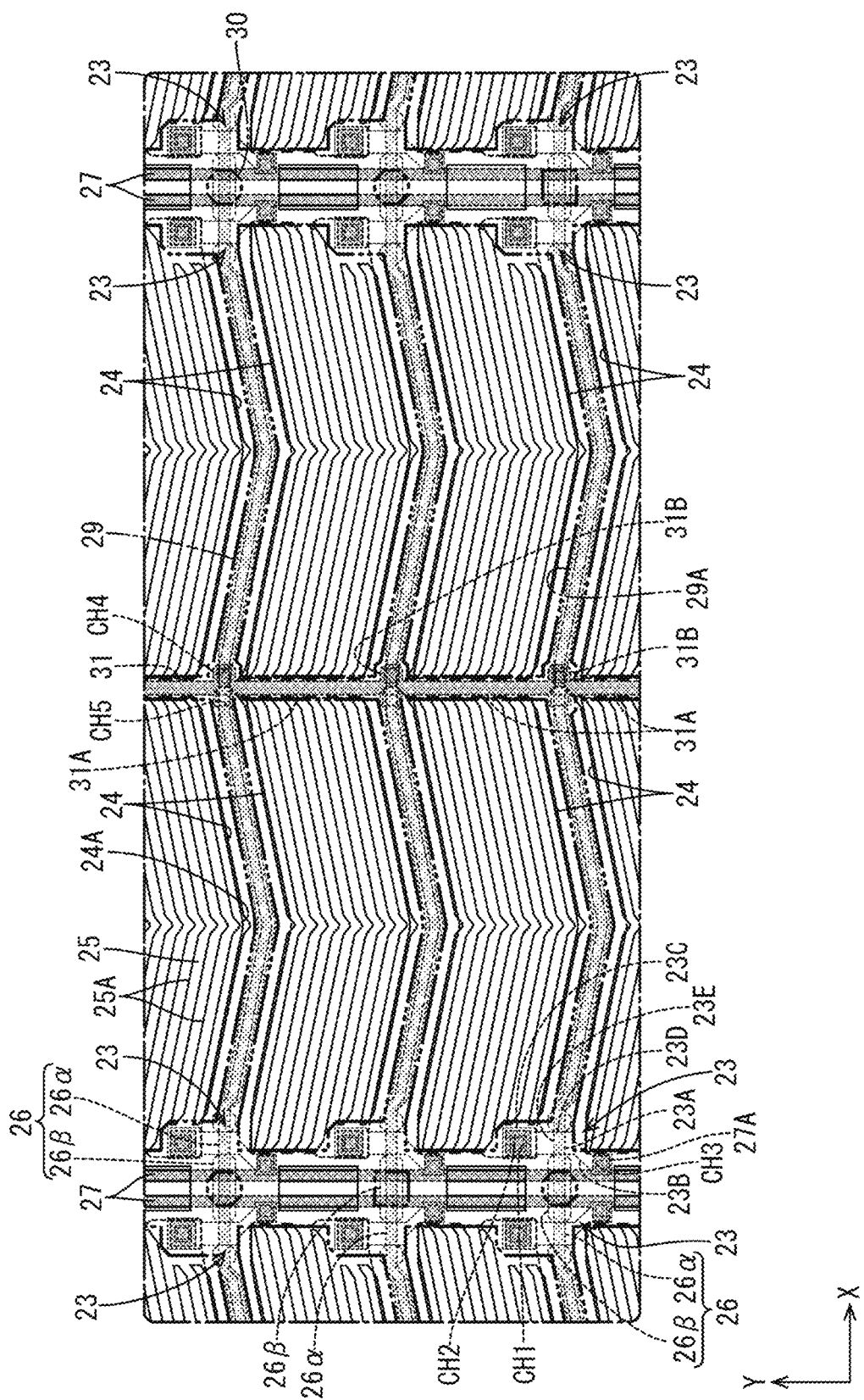
FIG. 6 is a plan view illustrating a pattern of a first metal film and a third metal film provided on an array substrate.
Figure 7:
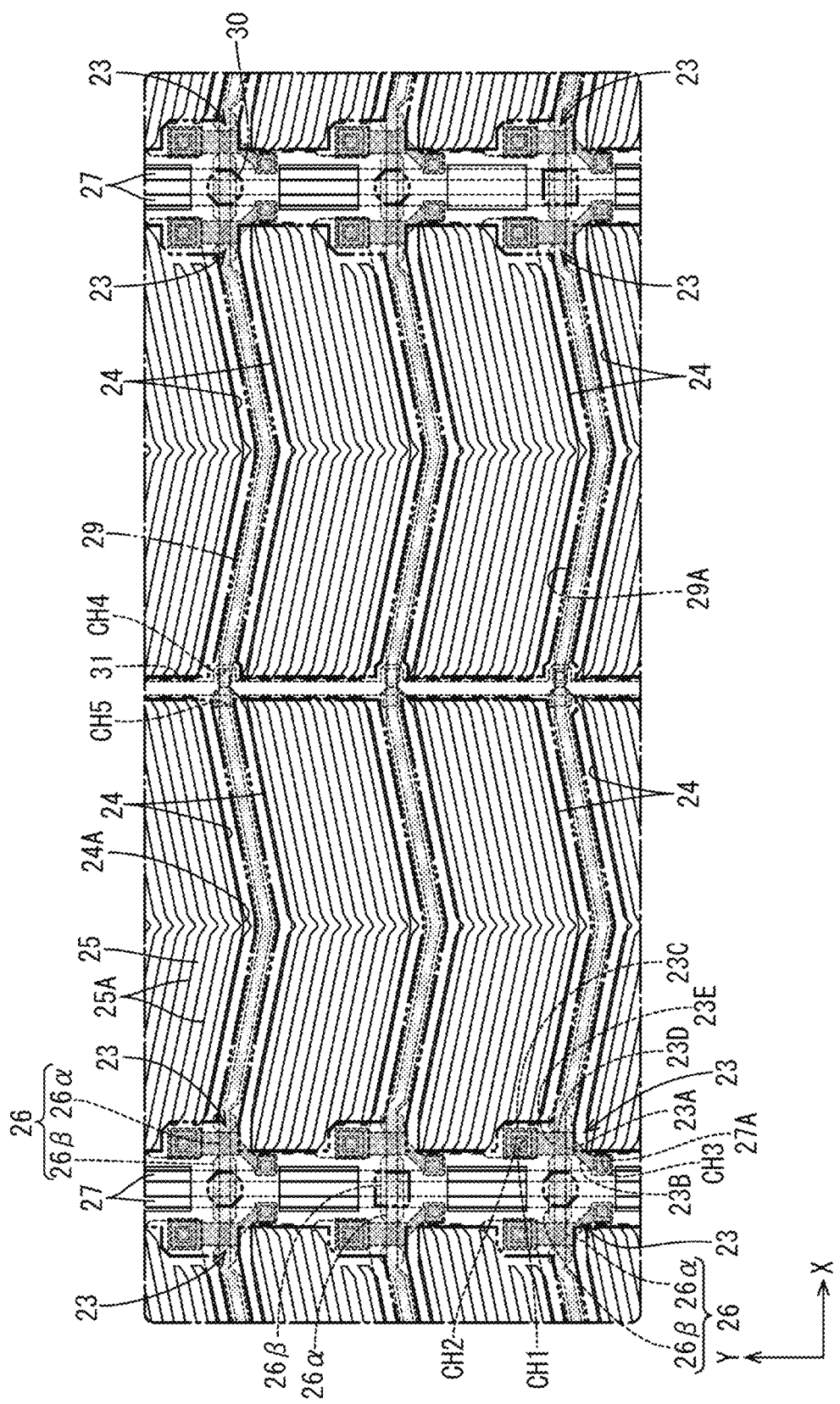
FIG. 7 is a plan view illustrating a pattern of a semiconductor film and a second metal film provided on the array substrate.

A configuration of the TFT 23 will be described in detail with reference to FIG. 6 and FIG. 7. FIG. 6 is a plan view illustrating a pattern of a first gate electrode 23A, the source wiring lines 27, and the like (a first metal film 32 and a third metal film 38 that will be described below) of a TFT 23 provided on the array substrate 21. In FIG. 6, the first metal film 32 and the third metal film 38 are illustrated in shaded area. FIG. 7 is a plan view illustrating a pattern of a channel region 23D, a second gate electrode 23E, and the like (a semiconductor film 34 and a second metal film 36 described below) of a TFT 23 provided on the array substrate 21. In FIG. 7, the semiconductor film 34 and the second metal film 36 are illustrated in shaded area. As illustrated in FIG. 6, each TFT 23 includes the first gate electrode (lower layer side gate electrode) 23A connected to the gate wiring line 26. A scanning signal transmitted to the gate wiring line 26 is supplied to the first gate electrode 23A. The TFT 23 has a source region 23B connected to the source wiring lines 27 as illustrated in FIG. 6 and FIG. 7. The source wiring line 27 includes a source wiring line widened part 27A projecting from a position, on a side opposite to the pixel electrode 24 (the lower side illustrated in FIG. 6) that is to be connected to the intersection portion with the gate wiring line 26 in the Y axis direction, to a position, on a pixel electrode 24 side (the left or the right side illustrated in FIG. 6) that is to be connected thereto in the X axis direction. The source region 23B extends in an oblique direction with respect to the X axis direction and the Y axis direction from the source wiring line widened part 27A to the channel region 23D, which will be described below, and is connected to the source wiring line widened part 27A and the channel region 23D. The TFT 23 has a drain region 23C spaced from the source region 23B in the Y axis direction as illustrated in FIG. 7. An end of the drain region 23C opposite to the source region 23B (channel region 23D) side is connected to the pixel electrode 24. The TFT 23 has the channel region 23D that is disposed to overlap the first gate electrode 23A on the upper layer side and continuous with the source region 23B and the drain region 23C. One end side portion (the lower end side portion illustrated in FIG. 7) of the channel region 23D in the Y axis direction is linked to the source region 23B, and the other end side portion (the upper end side portion illustrated in FIG. 7) is continuous with the drain region 23C.

The TFT 23 has the second gate electrode (an upper layer side gate electrode) 23E arranged to overlap the channel region 23D on the upper layer side as illustrated in FIG. 7. Since the second gate electrode 23E is electrically connected to the first gate electrode 23A, the scanning signal transmitted to the gate wiring line 26 is supplied at the same timing as the first gate electrode 23A. Since the channel region 23D is configured to be sandwiched between the first gate electrode 23A and the second gate electrode 23E from the lower layer side and the upper layer side in the Z axis direction in this manner, compared to a case in which only one gate electrode is disposed to overlap the channel region 23D, a drain current flowing into the channel region 23D can be increased. As a result, the pixel electrode 24 can be sufficiently charged even if a charging time of the pixel electrode 24 that is charged by the TFT 23 is reduced as the number of gate wiring lines 26 installed increases.

Figure 8:
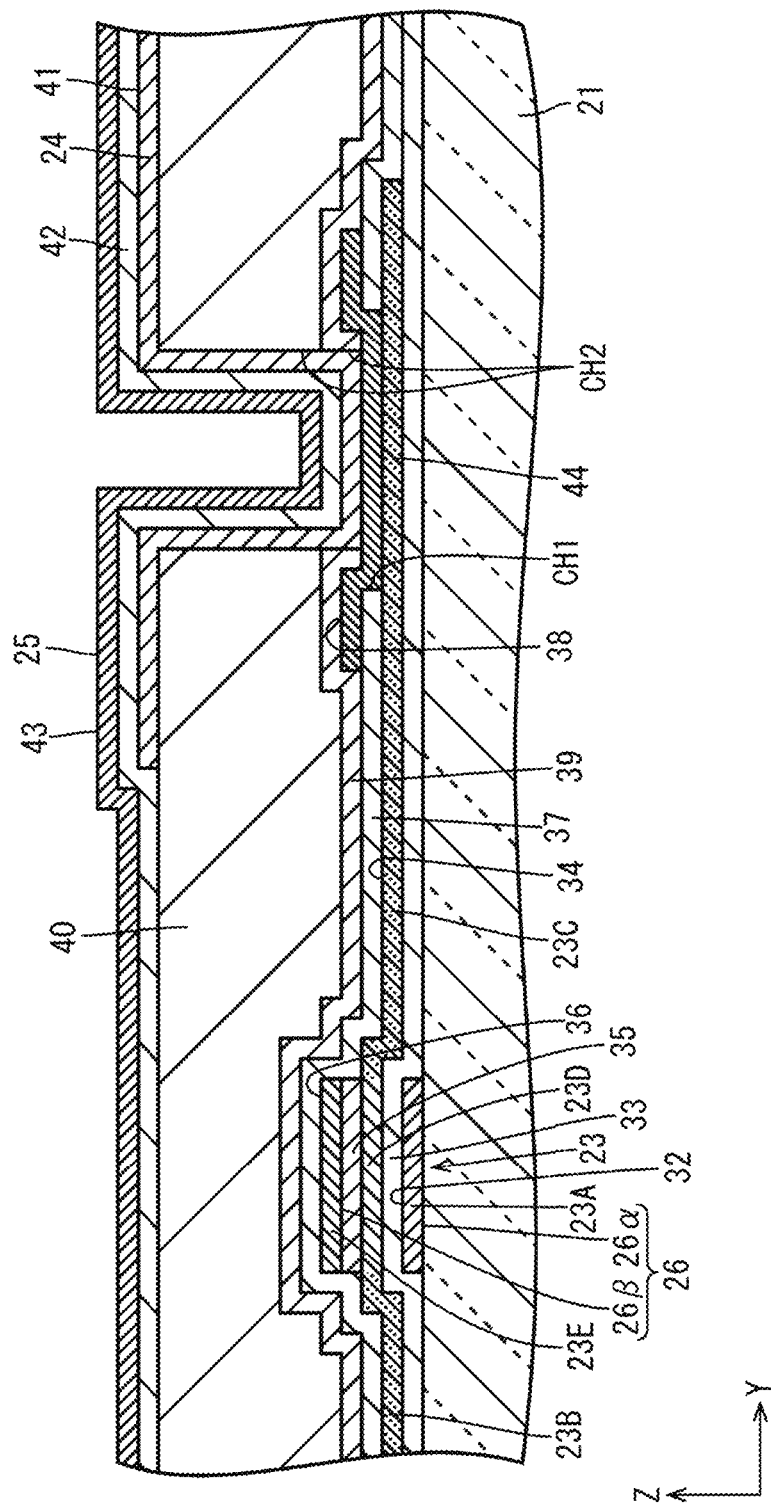
FIG. 8 is a cross-sectional view of the array substrate along the line C-C of FIG. 2.
Figure 9:
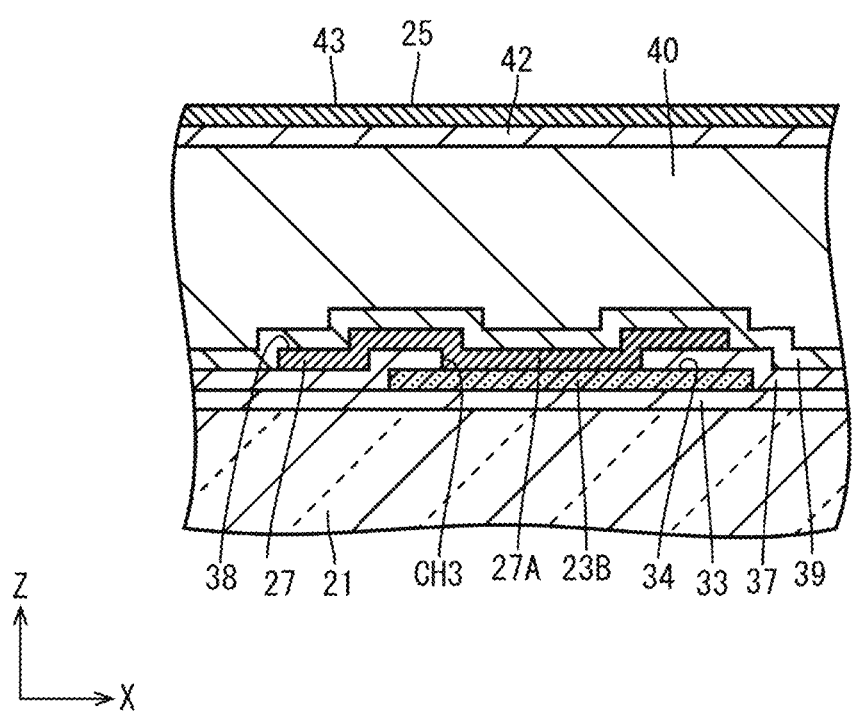
FIG. 9 is a cross-sectional view of the array substrate along the line D-D of FIG. 2.

Here, various films layered on the inner surface side of the array substrate 21 will be described with reference to FIG. 8 and FIG. 9. FIG. 8 and FIG. 9 are cross-sectional views of the array substrate 21 near the TFT 23, respectively. As illustrated in FIG. 8 and FIG. 9, the array substrate 21 includes: the first metal film (a conductive film) 32, a first gate insulating film (an insulating film or a lower layer side gate insulating film) 33, the semiconductor film 34, a second gate insulating film (an insulating film or an upper layer side gate insulating film) 35, the second metal film (a conductive film) 36, a first interlayer insulating film (an insulating film) 37, the third metal film (a conductive film) 38, a second interlayer insulating film (an insulating film) 39, a flattening film (an insulating film) 40, a first transparent electrode film 41, an inter-electrode insulating film (an insulating film) 42, and a second transparent electrode film 43 that are layered in order from the lower layer side (a glass substrate side).

The first metal film 32, the second metal film 36, and the third metal film 38 are a single layer film made from one type of metal material selected from copper, titanium, aluminum, molybdenum, tungsten, and the like; or a layered film or an alloy made from different types of metal materials and thus have conductivity and light blocking properties, respectively. As illustrated in FIG. 8, the first metal film 32 constitutes the first gate electrode 23A of the TFT 23, and the like. The second metal film 36 constitutes the second gate electrode 23E of the TFT 23, and the like. The third metal film 38, in addition to constituting the source wiring lines 27 and the like as illustrated in FIG. 9, constitutes a pixel intermediate electrode 44 connected to both the drain region 23C and the pixel electrode 24 as illustrated in FIG. 8. Since the pixel electrode 24 is connected to the drain region 23C via the pixel intermediate electrode 44, compared to a case in which the pixel electrode is directly connected to the drain region 23C, failure such as membrane breakage or the like does not easily occur in the pixel electrode 24, and the connection reliability is high. The first transparent electrode film 41 and the second transparent electrode film 43 are made of a transparent electrode material (for example, Indium Tin Oxide (ITO), Indium Zinc Oxide (IZO), or the like). The first transparent electrode film 41 constitutes each of the pixel electrodes 24 and the like. The second transparent electrode film 43 constitutes each of the common electrodes 25, and the like.

The semiconductor film 34 is an oxide semiconductor film using an oxide semiconductor as a material, for example, and has translucency. The semiconductor film 34 constitutes the source region 23B, the drain region 23C, the channel region 23D, and the like that constitute each TFT 23. An example of a specific material of the semiconductor film 34 includes, for example, an In—Ga—Zn—O-based semiconductor (for example, indium gallium zinc oxide). Here, the In—Ga—Zn—O-based semiconductor is a ternary oxide of indium (In), gallium (Ga), and zinc (Zn), and a ratio (composition ratio) of In, Ga, and Zn is not particularly limited and includes, for example, In:Ga:Zn=2:2:1, In:Ga:Zn=1:1:1, and In:Ga:Zn=1:1:2 but is not limited thereto. The In—Ga—Zn—O-based semiconductor may be amorphous or crystalline, and in a case of a crystalline semiconductor, a crystalline In—Ga—Zn—O-based semiconductor in which the c axis is aligned substantially perpendicular to a layer surface is preferable. Here, the semiconductor film 34 described above has a portion (a portion thereof that does not overlap the second metal film 36) having a low resistance in the manufacturing process and is composed of a low resistance region and a non-low resistance region. Specifically, after the semiconductor film 34 is patterned to have a predetermined planar shape, the semiconductor film 34 undergoes low resistance processing using the second gate insulating film 35 and the second metal film 36 that are layered on the upper layer side as masks. A portion of the semiconductor film 34 that is exposed without being covered by the second metal film 36 (a portion thereof not overlapping the second metal film 36) is a low resistance region, and a portion thereof covered by the second metal film 36 (a portion thereof overlapping the second metal film 36) is a non-low resistance region. Note that, in FIG. 8 and FIG. 9, low resistance regions of the semiconductor film 34 are illustrated in shaded area. The low resistance regions of the semiconductor film 34 function as a conductor with an extremely low resistivity such as a resistivity from, for example, approximately 1/10000000000 to 1/100, in comparison to a non-low resistance region. The low resistance regions of the semiconductor film 34 constitute the source region 23B and the drain region 23C of the TFT 23. While the non-low resistance region of the semiconductor film 34 allows charge to be transferred only under certain conditions (when a scanning signal is supplied to each of the gate electrodes 23A and 23E), the low resistance region functions as a conductor enabling transfer of charge at all times. The non-low resistance region of the semiconductor film 34 constitutes the channel region 23D of the TFT 23.

Each of the first gate insulating film 33, the second gate insulating film 35, the first interlayer insulating film 37, the second interlayer insulating film 39, and the inter-electrode insulating film 42 is made of an inorganic material such as silicon nitride ($SiN_x$), silicon oxide ($SiO_2$), or the like. The flattening film 40 is made of an organic material, for example, an acrylic resin (PMMA) or the like, and has a greater film thickness than other insulating films 33, 35, 37, 39, and 42 that are made of an inorganic material. This flattening film 40 flattens the surface of the array substrate 21. As illustrated in FIG. 8 and FIG. 9, the first gate insulating film 33 keeps the first metal film 32 on the lower layer side and the semiconductor film 34 on the upper layer side in an insulated state. In particular, an interval between the first gate electrode 23A and the channel region 23D is kept constant by a portion of the first gate insulating film 33 overlapping the first gate electrode 23A. The second gate insulating film 35 keeps the semiconductor film 34 on the lower layer side and the second metal film 36 on the upper layer side in an insulated state. In particular, an interval between the second gate electrode 23E and the channel region 23D is kept constant by a portion of the second gate insulating film 35 overlapping the second gate electrode 23E. The second gate insulating film 35 is patterned together with the second metal film 36 disposed on the upper layer side and is in a formation range in which substantially the entire second metal film 36 (excluding gate wiring line contact holes CH5 described below) is overlapped. The first interlayer insulating film 37 keeps the second metal film 36 on the lower layer side and the third metal film 38 on the upper layer side in an insulated state. The second interlayer insulating film 39 and the flattening film 40 keep the third metal film 38 on the lower layer side and the first transparent electrode film 41 on the upper layer side in an insulated state. The inter-electrode insulating film 42 keeps the first transparent electrode film 41 on the lower layer side and the second transparent electrode film 43 on the upper layer side in an insulated state.

As illustrated in FIG. 8, a first pixel contact hole CH1 for connecting the pixel intermediate electrode 44 to the drain region 23C is formed at a position of the first interlayer insulating film 37 overlapping both the drain region 23C and the pixel intermediate electrode 44. A second pixel contact hole CH2 for connecting the pixel electrode 24 to the pixel intermediate electrode 44 is formed at a position of the second interlayer insulating film 39 and the flattening film 40 overlapping both the pixel electrode 24 and the pixel intermediate electrode 44. The drain region 23C and the pixel electrode 24 are respectively connected to the pixel intermediate electrode 44 through each of the pixel contact holes CH1 and CH2. Since the pixel intermediate electrode 44 is arranged to cover the portion of the drain region 23C formed of the semiconductor film 34 facing the first pixel contact hole CH1 from the upper layer side, when the second interlayer insulating film 39 is etched through the flattening film 40 that is patterned during the formation of the second pixel contact hole CH2, the drain region 23C can be prevented from being overetched. Furthermore, a source contact hole CH3 for connecting the source wiring line widened part 27A to the source region 23B is formed at a position of the first interlayer insulating film 37 overlapping both the source wiring line widened part 27A and the source region 23B of the source wiring line 27 as illustrated in FIG. 9.

Figure 10:
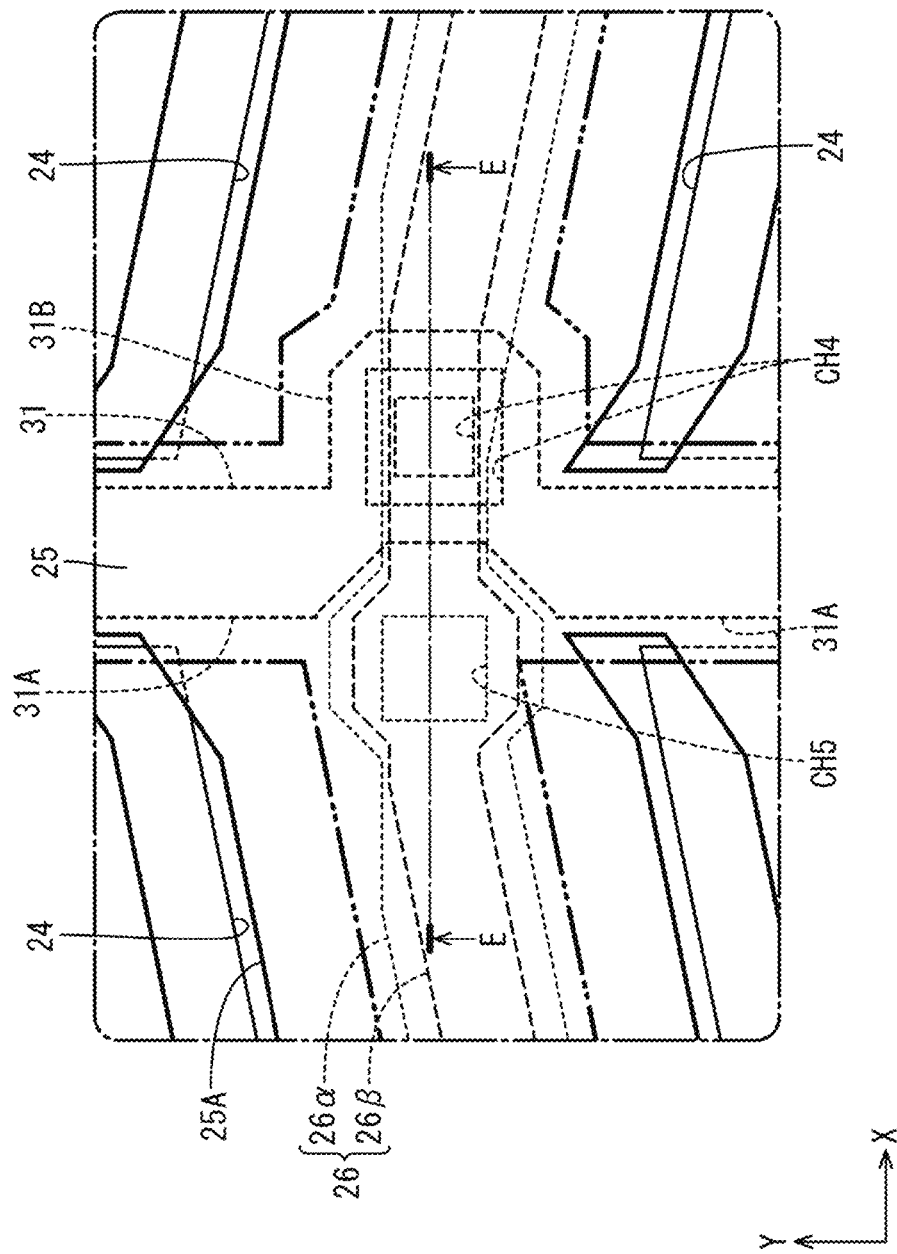
FIG. 10 is an enlarged plan view illustrating a region at or near an intersection of a gate wiring line and a common wiring line on the array substrate.
Figure 11:
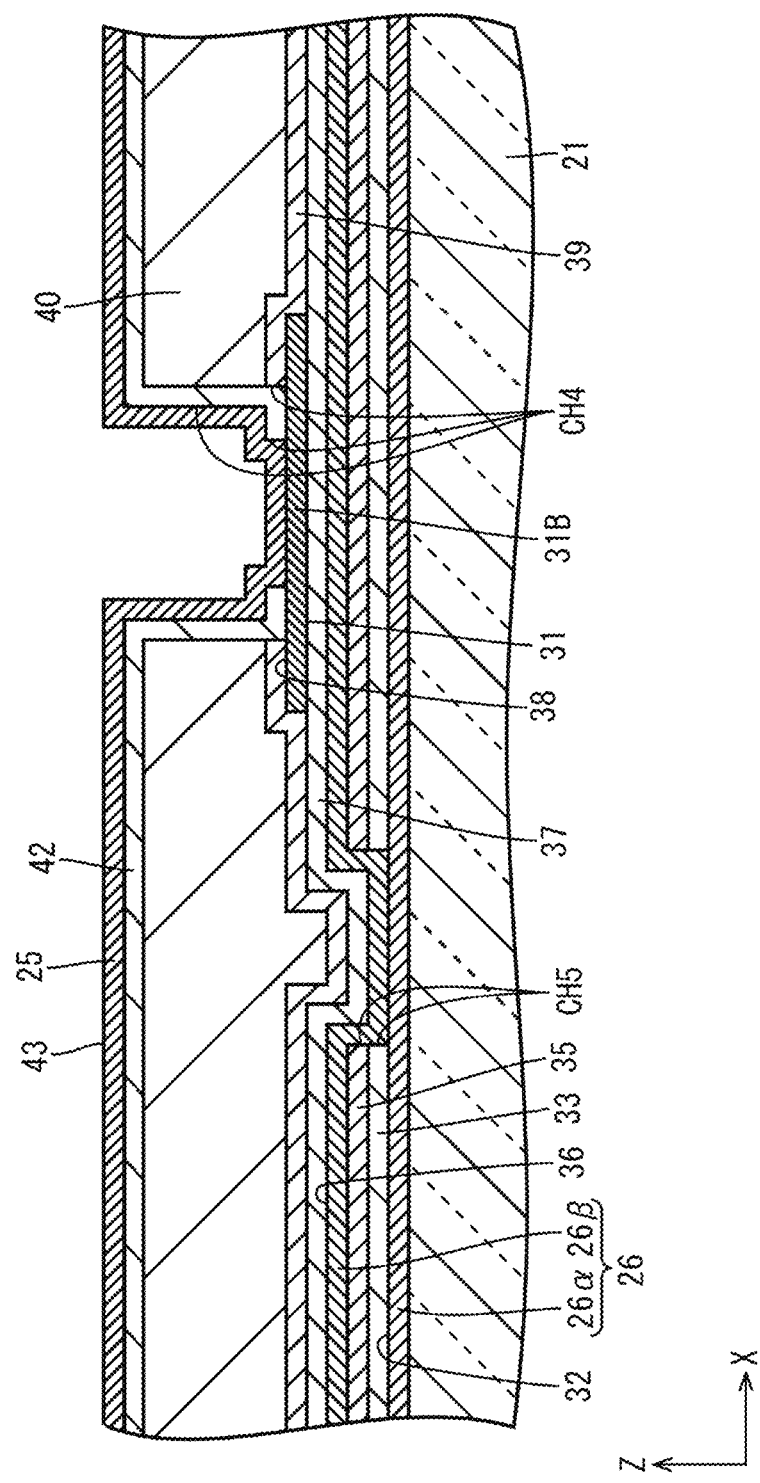
FIG. 11 is a cross-sectional view of the array substrate along the line E-E of FIG. 10.

Here, the common wiring line 31 will be described in detail with reference to FIG. 10 and FIG. 11 in addition to FIG. 4 and FIG. 6 mentioned above. FIG. 10 is an enlarged plan view illustrating a region at or near an intersection of the gate wiring line 26 and the common wiring line 31 on the array substrate 21. FIG. 11 is a cross-sectional view of the common wiring line 31, the common electrode 25, and the gate wiring line 26 on the array substrate 21 that have been cut. As illustrated in FIG. 6, the common wiring line 31 extends in the short side direction (the Y axis direction) of the pixel electrode 24, that is, the extension direction of the source wiring lines 27 in the display region AA of the array substrate 21, and intersects (overlaps) all of the gate wiring lines 26 in the same manner as the source wiring lines 27. The common wiring line 31 is disposed to overlap the common electrode 25 to be connected over substantially entire regions in a plan view. In addition, the common wiring line 31 is disposed to be sandwiched between two pixel electrodes 24 adjacent to each other without having the source wiring line 27 therebetween in the X axis direction. In other words, the common wiring line 31 is disposed to sandwich the pixel electrodes 24 together with the source wiring line 27 in the X axis direction. The common wiring line 31 is selectively disposed in a non-source wiring line disposition region in which no source wiring line 27 is disposed among vacant regions between the pixel electrodes 24 arranged in the X axis direction. One common wiring line 31 is disposed in each of the non-source wiring line disposition regions. Thus, the non-source wiring line disposition regions have a smaller dimension in the X axis direction than the source wiring line disposition regions in which the two source wiring lines 27 are arranged side by side. The number of common wiring lines 31 installed is approximately half the number of pixel electrodes 24 arranged in the X axis direction and the number of source wiring lines 27 installed. The non-source wiring line disposition regions can be said to be common wiring line disposition regions in which the common wiring lines 31 are disposed.

In addition, each common wiring line 31 is formed of a portion of the same third metal film 38 as the source wiring lines 27 as illustrated in FIG. 4 and FIG. 6. In FIG. 6, the common wiring line 31 is illustrated in shaded area the same as the source wiring lines 27. In this way, the number of metal films (conductive films) can be reduced, compared to a case in which the light blocking portions and the source wiring lines that are connected to the common electrodes are formed of different metal films as in the prior art. While each common wiring line 31 is formed of the portion of the same third metal film 38 as the source wiring lines 27, the common wiring line 31 extends in the short side direction of the pixel electrodes 24 similarly to the source wiring lines 27 and sandwiches the pixel electrodes 24 together with the source wiring lines 27 in the long side direction of the pixel electrodes 24, and thus short-circuiting with the source wiring lines 27 can be avoided. Moreover, the non-source wiring line disposition region, which is a space adjacent to the pixel electrodes 24 in the long side direction on the side opposite to two source wiring lines 27 is effectively used as a disposition space of the common wiring lines 31 (common wiring line disposition region), and thus an aperture ratio is less likely to decrease due to the common wiring lines 31.

As illustrated in FIG. 6 and FIG. 10, the common wiring line 31 includes: a plurality of straight portions (inter-pixel electrode portions) 31A that has a straight line shape in the Y axis direction; and a plurality of bent portions (scanning wiring line crossing portions) 31B that are bent with respect to the straight portions 31A. Of the common wiring line 31, the straight portion 31A is formed of a portion adjacent to, in the X axis direction, the pixel electrodes 24 arranged in the Y axis direction and a length dimension thereof is approximately equal to a short side dimension of the pixel electrodes 24. The straight portion 31A is sandwiched between the pixel electrodes 24 adjacent in the X axis direction. The number of straight portions 31A included in the common wiring line 31 is the same as the number of pixel electrodes 24 arranged in the Y axis direction. Each bent portion 31B includes a portion of the common wiring line 31 that crosses each of the gate wiring lines 26 arranged in the Y axis direction. The bent portion 31B is disposed such that a majority of the bent portion 31B overlaps the gate wiring line 26. The number of bent portions 31B included in the common wiring line 31 is the same as the number of gate wiring lines 26 installed. The bent portion 31B is bent so as to protrude to the right side of FIG. 6 and FIG. 10 in the X axis direction with respect to the straight portion 31A.

In addition, the common wiring line 31 formed of the third metal film 38, as illustrated in FIG. 11, is connected to the common electrode 25 formed of the second transparent electrode film 43 through common wiring line contact holes CH4 that are formed in the second interlayer insulating film 39, the flattening film 40, and the inter-electrode insulating film 42 (insulating film) interposed therebetween. The common wiring line contact holes CH4 are disposed at positions overlapping each bent portion 31B of the common wiring line 31 as illustrated in FIG. 6 and FIG. 10. That is, the number of common wiring line contact holes CH4 installed and the planar disposition thereof are in a matching relationship with the number of bent portions 31B of the common wiring line 31 and the planar disposition thereof. The bent portions 31B and the common wiring line contact holes CH4 overlapping the bent portion 31B are regularly arranged at an interval about the short side dimension of the pixel electrodes 24 in the Y axis direction with respect to the common wiring lines 31. As a result, the resistance distribution of the common electrodes 25 arranged in a solid state in the display region AA is favorably reduced. Moreover, since the common wiring line contact holes CH4 are disposed to overlap the gate wiring lines 26, the gate wiring lines 26 makes it difficult to visually recognize display failure that can be caused by disturbed alignment of liquid crystal molecules included in the liquid crystal layer 22 attributable to the common wiring line contact hole CH4. As a result, the aperture ratio can be improved. Further, the common wiring line contact holes CH4 deviate to the right side of FIG. 6 in the X axis direction with respect to the center position of the straight portion 31A of the common wiring line 31 in the width direction based on the disposition of the bent portions 31B described above.

Next, the gate wiring line 26 will be described in detail with reference to FIG. 5, FIG. 6, FIG. 7, FIG. 10, and FIG. 11. As illustrated in FIG. 5 to FIG. 7, each gate wiring line 26 has a two-layer structure including: a first gate wiring line (a first scanning wiring line or lower layer side scanning wiring line) 26α formed of a portion of the first metal film 32; and a second gate wiring line (a second scanning wiring line or upper layer side scanning wiring line) 26β formed of a portion of the second metal film 36. The first gate wiring line 26α and the second gate wiring line 26β are electrically connected by a connection structure to be described below. As a result, the wiring resistance of the gate wiring lines 26 can be reduced, and the redundancy of the gate wiring lines 26 is achieved. As described above, the first metal film 32 that constitutes the first gate wiring line 26α is the metal film (conductive film) the same as the first gate electrode 23A. Thus, the first gate wiring line 26α is directly continuous with the first gate electrode 23A, and a portion of the first gate wiring line 26α (a portion overlapping the channel region 23D) constitutes the first gate electrode 23A. As described above, the second metal film 36 that constitutes the second gate wiring line 26β is the same metal film (conductive film) as the second gate electrode 23E. Thus, the second gate wiring line 26β is directly continuous with the second gate electrode 23E, and a portion of the second gate wiring line 26β (a portion overlapping the channel region 23D) constitutes the second gate electrode 23E. Since the first gate wiring line 26α and the second gate wiring line 26β are electrically connected, scanning signals transmitted by these to be supplied to the first gate electrodes 23A and the second gate electrodes 23E are not likely to be dull. In particular, in the present embodiment, this is preferred because a drive time of the TFTs 23 tends to decrease as the arrangement interval of the source wiring lines 27 are greater than the arrangement interval of the gate wiring lines 26.

As illustrated in FIG. 6 and FIG. 7, the first gate wiring line 26α and the second gate wiring line 26β have line widths different from each other in most parts and have a magnitude relationship varying depending on a position in the X axis direction. Specifically, among the first gate wiring line 26α and the second gate wiring line 26β, the second gate wiring line 26β has a narrower width than the first gate wiring line 26α for a portion adjacent to the pixel electrode 24. Here, since the second gate wiring line 26β formed of the second metal film 36 is disposed on the upper layer side of the first gate wiring line 26α formed of the first metal film 32, parasitic capacitance generated between the portion adjacent to the pixel electrode 24 and the pixel electrode 24 tends to increase. In that regard, since the portion of the second gate wiring line 26β adjacent to the pixel electrode 24 is narrower than the first gate wiring line 26α, parasitic capacitance generated between the portion of the second gate wiring line 26β adjacent to the pixel electrode 24 and the pixel electrode 24 is reduced. However, if the second gate wiring line is narrower than the first gate wiring line 26α over the entire length, there is concern that the wiring resistance of the second gate wiring line becomes high and a difference in wiring resistance between the second gate wiring line and the first gate wiring line 26α may occur. In that regard, among the first gate wiring line 26α and the second gate wiring line 26β, the second gate wiring line 26β has a wider width than the first gate wiring line 26α for a portion that intersects every two source wiring lines 27 and is adjacent to every two TFTs 23. In this way, the wiring resistance of the second gate wiring line 26β can be prevented from increasing, and the difference in wiring resistance that can occur between the second gate wiring line 26β and the first gate wiring line 26α can be mitigated.

As illustrated in FIG. 6 and FIG. 7, the first gate wiring line 26α formed of the first metal film 32 and the second gate wiring line 26β formed of the second metal film 36 are arranged to overlap each other in most parts. In this way, arrangement spaces of the gate wiring lines 26 can be reduced, which is preferable for improving an aperture ratio. As illustrated in FIG. 11, the first gate insulating film 33 and the second gate insulating film 35 are interposed between the first gate wiring line 26α and the second gate wiring line 26β overlapping each other. In addition, the first gate wiring line 26α and the second gate wiring line 26β are connected through gate wiring line contact holes CH5 that are formed in the first gate insulating film 33 and the second gate insulating film 35 that are interposed between the overlapping portion of the gate wiring lines. As illustrated in FIG. 10 and FIG. 11, the gate wiring line contact holes CH5 are disposed at a position between the pixel electrodes 24 adjacent in the X axis direction with the common wiring line 31 sandwiched therebetween. According to this configuration, display failure, which may be caused by disturbed alignment of liquid crystal molecules included in the liquid crystal layer 22 attributable to the gate wiring line contact holes CH5 is less likely to affect the display by the pixel electrodes 24. As a result, the aperture ratio can be improved. More specifically, the gate wiring line contact holes CH5 are arranged to be adjacent to the left side of FIG. 10 in the X axis direction with respect to the common wiring line contact holes CH4 described above. The gate wiring line contact holes CH5 do not overlap the common wiring line 31 and deviates to the side opposite to the common wiring line contact holes CH4 in the X axis direction with respect to the center position of the straight portion 31A of the common wiring line 31 in the width direction (the left side of FIG. 10). The gate wiring line contact holes CH5 are regularly arranged at substantially the same interval as the arrangement interval of the common wiring lines 31 (the non-source wiring line disposition region) in the X axis direction. As a result, resistance distribution in the gate wiring lines 26 extending in the X axis direction is favorably reduced. The number of gate wiring line contact holes CH5 arranged in the Y axis direction is the same as the number of gate wiring lines 26 installed. The number of gate wiring line contact holes CH5 arranged in the X axis direction is the same as the number of common wiring lines 31 installed.

Figure 12:
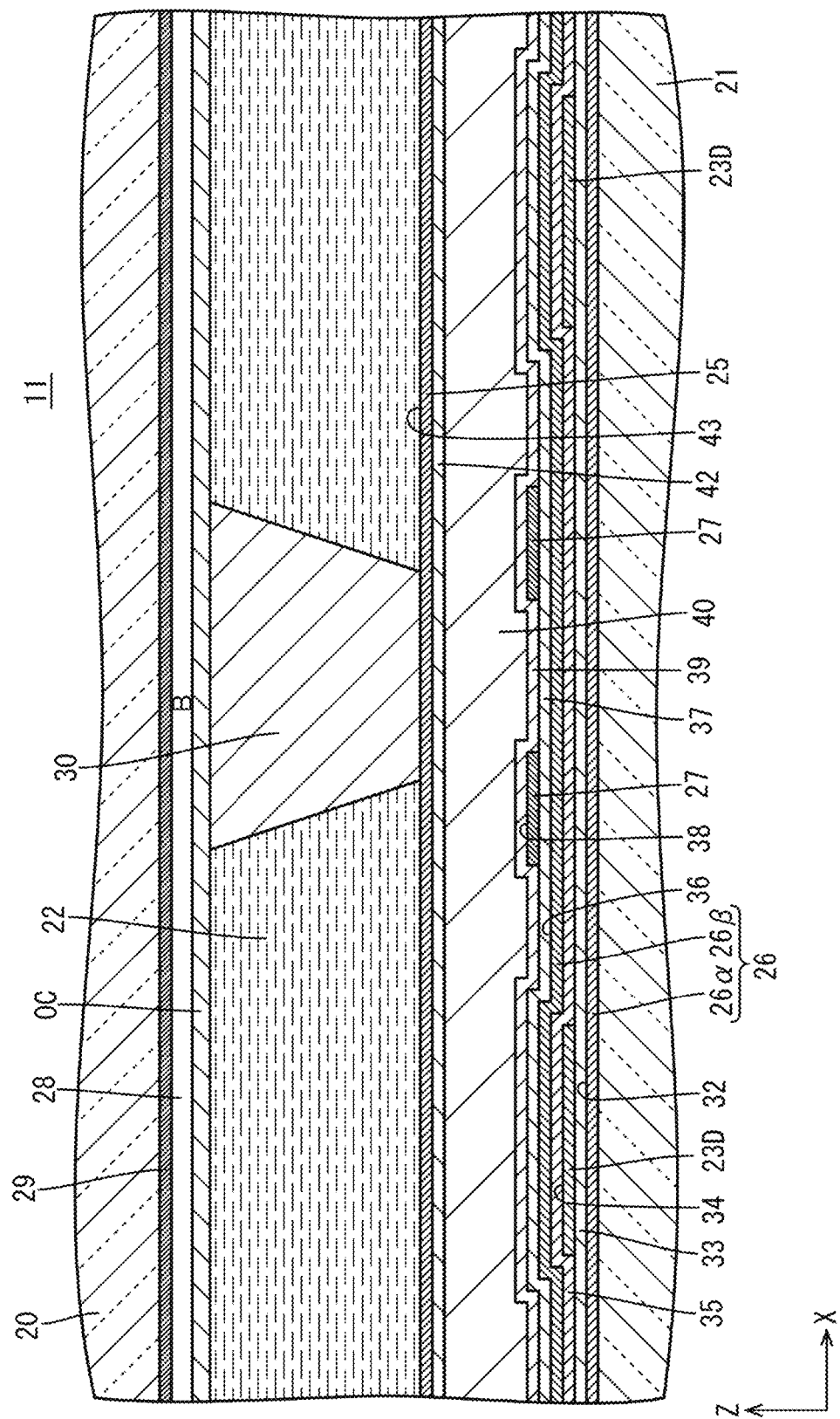
FIG. 12 is a cross-sectional view of the liquid crystal panel along the line F-F of FIG. 2.

Next, the spacer part 30 will be described in detail with reference to FIG. 12 in addition to FIG. 2 described above. FIG. 12 is a cross-sectional view of the liquid crystal panel 11 at or near the spacer part 30. As illustrated in FIG. 2 and FIG. 12, the spacer part 30 has a column shape that protrudes from a flattening film OC toward the array substrate 21 side in a manner of penetrating the liquid crystal layer 22 in the CF substrate 20, and the tip of the protruding portion thereof can face and be in contact with the innermost surface (alignment film) of the array substrate 21. As a result, the interval between the pair of substrates 20 and 21 in the display region AA, that is, the cell gap (the thickness of the liquid crystal layer 22) can be maintained constant. A plurality of the spacer parts 30 are regularly distributed within the display region AA. The spacer part 30 is formed of, for example, a substantially transparent photosensitive resin material and is formed by being patterned in a known photolithography method in the manufacturing process of the CF substrate 20. In addition, the spacer part 30 according to the present embodiment has a substantially square shape or a substantially regular octagon in terms of a planar shape as illustrated in FIG. 2 but is not necessarily limited thereto and may be, for example, a polygon other than a square or a regular octagon, a substantial circular shape, an elliptical shape, or the like. Note that all of the plurality of spacer parts 30 distributed within the display region AA are not necessarily in contact with the array substrate 21. For example, the spacer parts 30 may include a plurality of types of different protruding heights, and the spacer parts 30 having a low protruding height may not be in contact with and may be spaced apart from the innermost surface of the array substrate 21, in a state in which no external force is applied to the liquid crystal panel 11. In a state in which deformation occurs on the pair of substrates 20 and 21 as external forces act on the liquid crystal panel 11 and the thickness of the liquid crystal layer 22 is narrowed, the spacer parts 30 having a low protruding height can come into contact with the innermost surface of the array substrate 21 and limit further deformation.

As illustrated in FIG. 2 and FIG. 12, the spacer parts 30 are disposed at positions on the array substrate 21 overlapping at or near the intersections between the gate wiring lines 26 and the source wiring lines 27 in a plan view. Specifically, each spacer part 30 is disposed in the X axis direction at an intermediate position between two source wiring lines 27 that are adjacent to each other at an interval in the X axis direction. The spacer part 30 is arranged such that both ends thereof in the X axis direction overlap two source wiring lines 27, respectively. The spacer part 30 is disposed in the Y axis direction at the center position of the line width of the gate wiring line 26. The spacer part 30 is arranged such that the center portion thereof in the Y axis direction overlaps the gate wiring line 26. In this manner, since the spacer parts 30 are arranged to overlap the gate wiring lines 26 and the source wiring lines 27 in a plan view, the gate wiring lines 26 and the source wiring lines 27 make it difficult to visually recognize the display failure that may be caused by disturbed alignment of liquid crystal molecules included in the liquid crystal layer 22 attributable to the spacer parts 30. Moreover, since the spacer parts 30 are avoided from being arranged to overlap the common wiring line contact holes CH4, which are a connection structure of the common wiring lines 31 and the common electrodes 25, the spacer parts 30 can appropriately exhibit the substrate interval maintaining function. The spacer parts 30 are arranged at an interval in the X axis direction that is approximately twice the long side dimension of the pixel electrode 24 and are arranged at an interval in the Y axis direction that is approximately the arrangement interval of the gate wiring lines 26. The number of spacer parts 30 arranged in the X axis direction is approximately half the number of source wiring lines 27 installed, and the number of spacer parts arranged in the Y axis direction is the same as the number of gate wiring lines 26 installed.

However, the liquid crystal panel 11 is bent around the axis of curvature CAX from the flat state of plate surface of the liquid crystal panel during manufacturing as illustrated in FIG. 1, and there is a concern that the contact positions (positions in a plan view) of the spacer parts 30 with respect to the array substrate 21 side vary in the curve direction due to the deformation. If the contact positions of the spacer parts 30 vary, variations in the interval between the array substrate 21 and the CF substrate 20 held by the spacer parts 30 may be caused. In that regard, since the array substrate 21 and the CF substrate 20 are formed such that the curve direction coincides with the arrangement direction of the two source wiring lines 27 sandwiched between two pixel electrodes 24 adjacent to each other in the long side direction of the pixel electrode 24 as illustrated in FIG. 1 and FIG. 2, even if the contact positions of the spacer parts 30 with respect to the array substrate 21 side vary in the curve direction due to the array substrate 21 and the CF substrate 20 being curved around the axis of curvature CAX, the spacer parts 30 are unlikely to come into contact with the array substrate 21 at a position at which the spacer parts 30 do not overlap the two source wiring lines 27, and the spacer parts 30 are highly likely to come into contact with the array substrate 21 at a position at which the spacer parts 30 overlap any of the two source wiring lines 27. As a result, no variation in the interval between the array substrate 21 and the CF substrate 20 held by the spacer parts 30 is likely to occur, the interval is stable, and thus the display quality is satisfactory.

As described above, the liquid crystal panel (display device) 11 of the present embodiment includes: a plurality of the pixel electrodes 24 having a long shape and arranged in at least in the long side direction thereof; the common electrode 25 overlapping the pixel electrodes 24 with the inter-electrode insulating film (insulating film) 42 therebetween; the source wiring line (image wiring line) 27 extending in the short side direction of the pixel electrodes 24, disposed such that two source wiring lines are sandwiched between two pixel electrodes 24 adjacent to each other in the long side direction, and supplying an image signal to each of the pixel electrodes 24 adjacent to each other in the long side direction; and the common wiring line 31 extending in the short side direction, disposed to sandwich the pixel electrodes 24 together with the source wiring line 27 in the long side direction, connected to the common electrode 25, and including a portion formed of a portion of the same third metal film (conductive film) 38 as the source wiring line 27.

In this way, the two source wiring lines 27 sandwiched between two pixel electrodes 24 adjacent to each other in the long side direction of the pixel electrodes 24 having the long shape supply image signals to each of the pixel electrodes 24 adjacent in the long side direction, and thus the pixel electrodes 24 are charged to the potential based on the image signals. In contrast, by the connected common wiring lines 31, a common potential is supplied to the common electrodes 25 that overlap the pixel electrodes 24 via the inter-electrode insulating film 42. A display is made based on a potential difference generated between the charged pixel electrodes 24 and the common electrodes 25. Furthermore, since the common wiring lines 31 include the portion formed of the portion of the same third metal film 38 as the source wiring lines 27, the number of metal films (conductive films) can be reduced, compared to a case in which the light blocking portion and the source wiring line that are connected to the common electrode are composed of different metal films as in the prior art. While the common wiring lines 31 includes the portion formed of the portion of the same third metal film 38 as the source wiring lines 27, the common wiring lines extend in the short side direction of the pixel electrodes 24, similarly to the source wiring lines 27, and are disposed to sandwich the pixel electrodes 24 together with the source wiring lines 27 in the long side direction, and thus short-circuiting with the source wiring lines 27 can be avoided. Moreover, the spaces adjacent to the pixel electrodes 24 in the long side direction on the side opposite to the two source wiring lines 27 are effectively used as disposition spaces for the common wiring lines 31, and an aperture ratio is less likely to decrease due to the common wiring lines 31.

Further, the gate wiring lines (scanning wiring lines) 26 that are disposed adjacent to the pixel electrodes 24 in the short side direction and extend in the long side direction are provided, and the common wiring lines 31 and the common electrodes 25 are arranged to overlap each other with the second interlayer insulating film 39 therebetween, the flattening film 40, and the inter-electrode insulating film 42 (insulating film) and are connected through the common wiring line contact holes CH4 that are formed at the positions overlapping the gate wiring lines 26 in the second interlayer insulating film 39, the flattening film 40, and the inter-electrode insulating film 42. In this way, a common potential is supplied to the common electrodes 25 by connecting the common wiring lines 31 to the overlapping common electrodes 25 via the second interlayer insulating film 39, the flattening film 40, and the inter-electrode insulating film 42, through the common wiring line contact holes CH4 that are formed in the second interlayer insulating film 39, the flattening film 40, and the inter-electrode insulating film 42. While display failure tends to easily occur at or near the common wiring line contact holes CH4, the common wiring line contact holes CH4 are arranged to overlap the gate wiring lines 26, and thus the gate wiring lines 26 make it difficult to visually recognize the display failure caused by the common wiring line contact holes CH4.

In addition, the gate wiring lines 26 that are arranged adjacent to the pixel electrodes 24 in the short side direction and extend in the long side direction; and the TFTs (switching elements) 23 connected to the pixel electrodes 24, the source wiring lines 27, and the gate wiring lines 26 are provided, and each of the TFTs 23 includes: the first gate electrode 23A that is connected to the gate wiring line 26; the channel region 23D that is formed of the semiconductor film 34 and disposed to overlap the first gate electrode 23A on the upper layer side with the first gate insulating film 33 therebetween; the second gate electrode 23E that is arranged to overlap the channel region 23D on the upper layer side with the second gate insulating film 35 therebetween and is connected to the first gate electrode 23A; the source region 23B connected to one end side portion of the channel region 23D and the source wiring line 27; and the drain region 23C that is connected to the other end side portion of the channel region 23D and the pixel electrode 24. In this way, when a scanning signal transmitted to the gate wiring line 26 is supplied to the first gate electrode 23A and the second gate electrode 23E, the TFT 23 is driven. Then, an image signal transmitted to the source wiring line 27 is supplied to the source region 23B and is supplied from the source region 23B to the drain region 23C via the channel region 23D. Since the drain region 23C is connected to the pixel electrode 24, the pixel electrode 24 is charged to an electric potential based on the image signal transmitted to the source wiring line 27. Here, in the configuration in which a plurality of the pixel electrodes 24, source wiring lines 27, and gate wiring lines 26 are provided respectively, in a case where the gate wiring lines 26 are arranged to extend in the long side direction of the pixel electrode 24, the arrangement interval of the source wiring lines 27 is greater than the arrangement interval of the gate wiring lines 26, and the number of gate wiring lines 26 installed tends to be greater than the number of source wiring lines 27 installed. As a result, a drive time of the TFTs 23 driven based on scanning signals supplied to the gate wiring lines 26 and a charging time of the pixel electrodes 24 charged by the TFTs 23 tend to be short. In that regard, since each TFT 23 is driven by the first gate electrode 23A disposed to overlap the channel region 23D on the lower layer side via the first gate insulating film 33; and by the second gate electrode 23E that is disposed to overlap the channel region 23D on the upper layer side via the second gate insulating film 35 and is connected to the first gate electrode 23A, a current flowing into the channel region 23D can be increased, compared to a case in which only one gate electrode is disposed to overlap the channel region 23D. This makes it possible to sufficiently charge the pixel electrodes 24 even in a short charging time.

In addition, each gate wiring line 26 includes: the first gate wiring line (first scanning wiring line) 26α formed of a portion of the same first metal film (conductive film) 32 as the first gate electrode 23A and continuous with the first gate electrode 23A; and the second gate wiring line (second scanning wiring line) 26β formed of a portion of the same second metal film (conductive film) 36 as the second gate electrode 23E, continuous with the second gate electrode 23E, and connected to the first gate wiring line 26α. In this way, the first gate wiring line 26α and the second gate wiring line 26β connected to each other are included in the gate wiring line 26, which is favorable for reducing the wiring resistance of the gate wiring line 26. Thus, scanning signals transmitted by the first gate wiring line 26α and the second gate wiring line 26β and supplied to the first gate electrode 23A and the second gate electrode 23E are not likely to be dull. In particular, it is favorable to a case that, as the arrangement interval of the source wiring lines 27 is greater than the arrangement interval of the gate wiring lines 26, the drive time of the TFTs 23 tends to be short.

In addition, the first gate wiring line 26α and the second gate wiring line 26β are disposed such that at least a portion of the wiring lines overlaps each other with the first gate insulating film 33 and the second gate insulating film 35 (insulating film) therebetween. In this way, arrangement spaces of the gate wiring lines 26 can be reduced, which is preferable for improving an aperture ratio.

In addition, the first gate wiring line 26α and the second gate wiring line 26β are connected through gate wiring line contact holes CH5 that are formed at the position between the pixel electrodes 24 adjacent in the long side direction with the common wiring line 31 sandwiched therebetween, while the first gate insulating film 33 and the second gate insulating film 35 are interposed between the overlapping portion of the gate wiring lines. In this way, since the first gate wiring line 26α and the second gate wiring line 26β overlapping via the first gate insulating film 33 and the second gate insulating film 35 are connected through the gate wiring line contact holes CH5 that are formed in the first gate insulating film 33 and the second gate insulating film 35, scanning signals are supplied to the first gate wiring line 26α and the second gate wiring line 26β at the same timing. While display failure tends to easily occur at or near the gate wiring line contact holes CH5, the gate wiring line contact holes CH5 are arranged at the position between the pixel electrodes 24 adjacent in the long side direction with the common wiring line 31 sandwiched therebetween, and thus the display failure caused by the gate wiring line contact holes CH5 is less likely to affect the display by the pixel electrodes 24.

In addition, the second gate wiring line 26β has the portion adjacent to the pixel electrode 24 being narrow and has the portion adjacent to the TFT 23 being wide in comparison to the first gate wiring line 26α. Since the second gate wiring line 26β is disposed on the upper layer side of the first gate wiring line 26α, the parasitic capacitance generated between the portion adjacent to the pixel electrode 24 and the pixel electrode 24 tends to increase. In that regard, since the portion of the second gate wiring line 26β adjacent to the pixel electrode 24 is narrower than the first gate wiring line 26α, parasitic capacitance generated between the portion of the second gate wiring line 26β adjacent to the pixel electrode 24 and the pixel electrode 24 is reduced. However, if the second gate wiring line is narrower than the first gate wiring line 26α over the entire length, there is concern that the wiring resistance of the second gate wiring line becomes high and a difference in wiring resistance between the second gate wiring line and the first gate wiring line 26α may occur. In that regard, since the portion of the second gate wiring line 26β adjacent to the TFT 23 is wider than the first gate wiring line 26α, an increase in the wiring resistance of the second gate wiring line 26β can be suppressed, and a difference in wiring resistance that can occur between the second gate wiring line and the first gate wiring line 26α can be mitigated.

In addition, the array substrate (first substrate) 21 provided with at least the pixel electrodes 24, the common electrodes 25, the source wiring lines 27, and the common wiring lines 31; the CF substrate (second substrate) 20 disposed to face the array substrate 21 with an interval therebetween; and the spacer parts 30 provided on the CF substrate 20 and interposed between the CF substrate 20 and the array substrate 21 to maintain an interval with the array substrate 21 are provided, and the spacer parts 30 are arranged such that each of the spacer parts overlaps at least one of two source wiring lines 27 sandwiched between two pixel electrodes 24 adjacent in the long side direction. In this way, the array substrates 21 and the CF substrate 20 facing each other at an interval maintain the interval by having the spacer parts 30 provided on the CF substrate 20 and interposed between the CF substrate 20 and the array substrates 21. Here, the display quality tends to locally decrease around the spacer part 30. In this regard, since the spacer parts 30 are arranged such that each of the spacer parts overlaps at least one of two source wiring lines 27 sandwiched between two pixel electrodes 24 adjacent in the long side direction of the pixel electrodes 24, the source wiring lines 27 make it difficult to visually recognize the display failure attributable to the spacer parts 30. Moreover, since the common wiring lines 31 are disposed to sandwich the pixel electrodes 24 together with the source wiring lines 27 in the long side direction, it is possible to prevent the spacer parts 30 from overlapping the connection structure of the common wiring lines 31 and the common electrodes 25. As a result, the substrate interval maintenance function of the spacer parts 30 can be appropriately exhibited.

In addition, the array substrate 21 and the CF substrate 20 are formed such that the plate surface thereof curves around at least one axis of curvature CAX and the curve direction thereof coincides with the long side direction. In this way, in a case that the spacer parts 30 provided on the CF substrate 20 are in contact with the array substrate 21, the adjoining positions thereof can vary in the curve direction due to the array substrate 21 and the CF substrate 20 being curved around at least one axis of curvature CAX, which leads to a concern of variation in the interval between the array substrate 21 and CF substrate 20 that are held by the spacer parts 30. In that regard, since the array substrate 21 and the CF substrate 20 are formed such that the curve direction coincides with the arrangement direction of the two source wiring lines 27 sandwiched between two pixel electrodes 24 adjacent to each other in the long side direction, even if the contact positions of the spacer parts 30 with respect to the array substrate 21 side vary in the curve direction due to the array substrate 21 and the CF substrate 20 being curved around at least one axis of curvature CAX, the spacer parts 30 are unlikely to come into contact with the array substrate 21 at a position at which the spacer parts 30 do not overlap the two source wiring lines 27, and the spacer parts 30 are highly likely to come into contact with the array substrate 21 at a position at which the spacer parts 30 overlap any of the two source wiring lines 27. As a result, no variation in the interval between the array substrate 21 and the CF substrate 20 held by the spacer parts 30 is likely to occur, the interval is stable, and thus the display quality is satisfactory.

Further, the gate wiring lines 26 that are disposed adjacent to the pixel electrodes 24 in the short side direction and extend in the long side direction are provided, and the spacer parts 30 are arranged to overlap the gate wiring lines 26. In this way, since the spacer parts 30 are arranged such that each of the spacer parts overlaps at least one of the two source wiring lines 27 and the gate wiring lines 26, the gate wiring lines 26 make it difficult to visually recognize the display failure caused by the spacer parts 30.

Second Embodiment

A second embodiment of the present invention will be described with reference to FIG. 13 to FIG. 15. In the second embodiment, a modified configuration of a common wiring line 131 will be introduced. Note that overlapping description of structures, actions, and effects similar to those of the first embodiment described above will be omitted.

Figure 13:
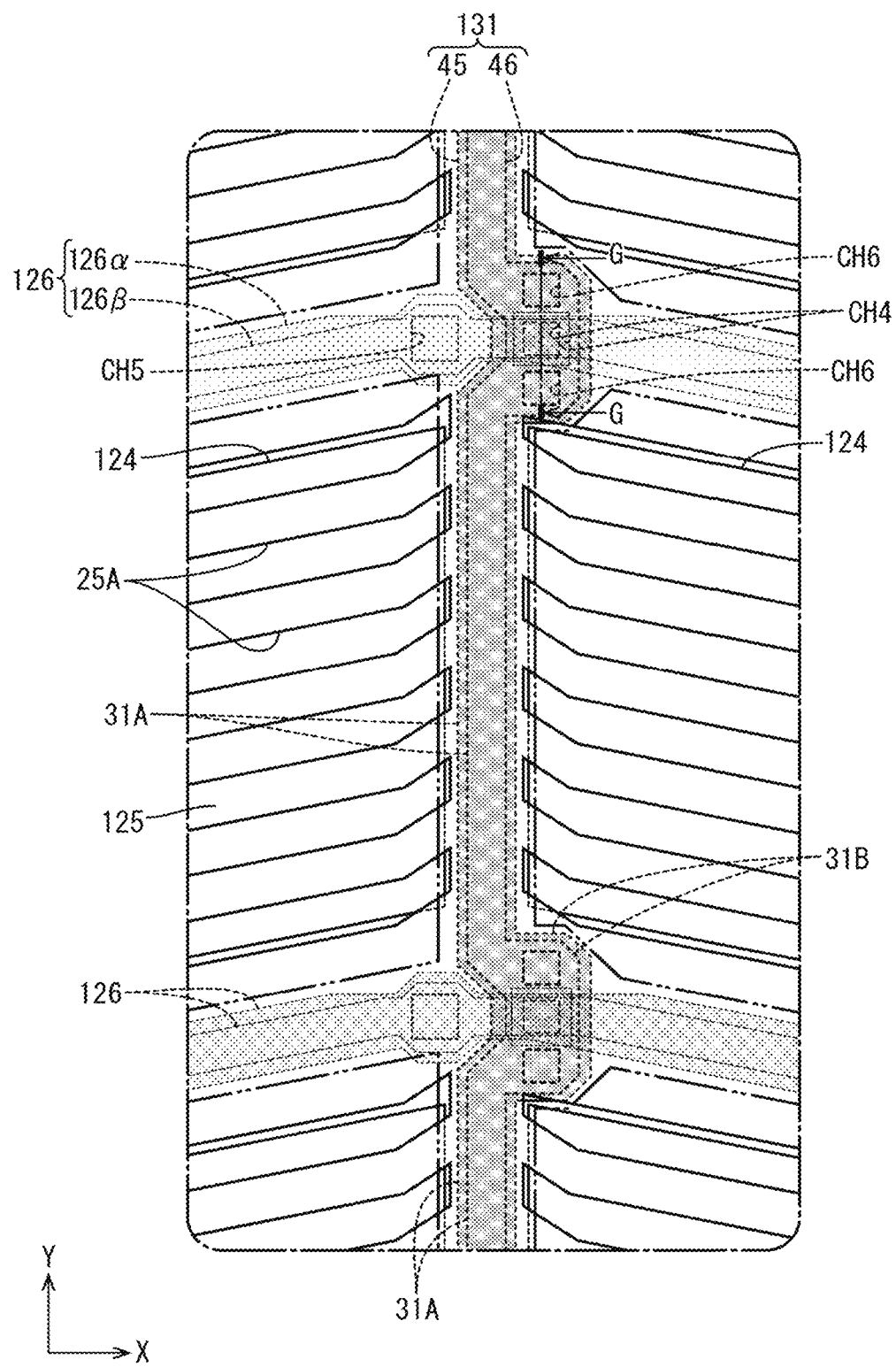
FIG. 13 is a plan view illustrating a pattern of a first metal film and a third metal film provided on an array substrate constituting a liquid crystal panel according to a second embodiment of the present invention.
Figure 14:
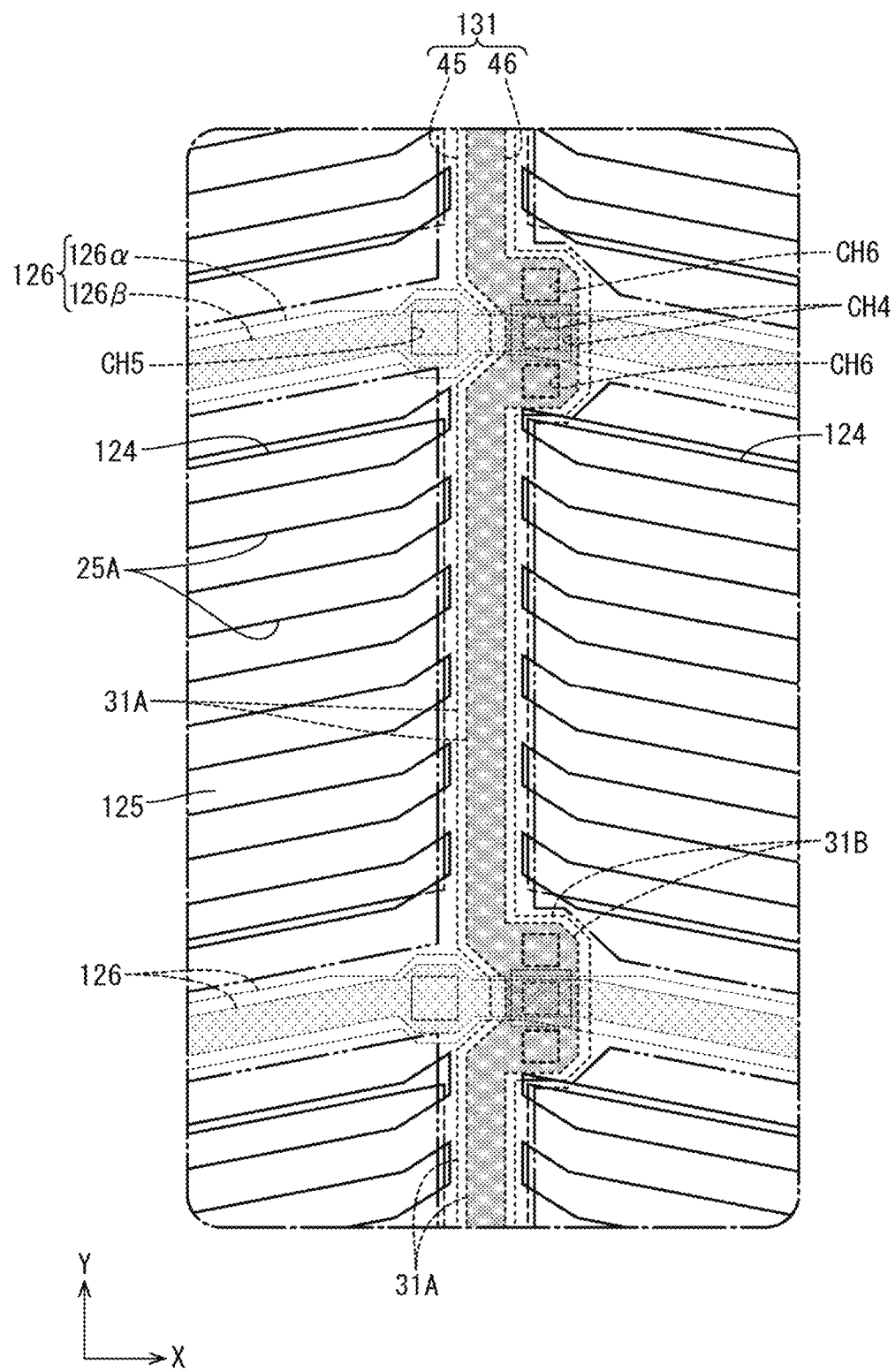
FIG. 14 is a plan view illustrating a pattern of a semiconductor film and a second metal film provided on the array substrate.

As illustrated in FIG. 13 and FIG. 14, the common wiring line 131 according to the present embodiment includes: a main wiring section 45 formed of a portion of the same third metal film 138 as a source wiring line; and a sub-wiring section 46 formed by reducing the resistance of a portion of the same semiconductor film 134 as a channel region of a TFT. FIG. 13 is a plan view illustrating a pattern of a first metal film 132 and the third metal film 138 provided on an array substrate 121. In FIG. 13, the first metal film 132 and the third metal film 138 are illustrated in shaded area. FIG. 14 is a plan view illustrating the pattern of the semiconductor film 134 and a second metal film 136 provided on the array substrate 121. In FIG. 14, the semiconductor film 134 and the second metal film 136 are illustrated in shaded area. The main wiring section 45 and the sub-wiring section 46 are disposed to overlap each other and electrically connected to each other with a first interlayer insulating film 137 therebetween. The sub-wiring section 46 includes a low-resistance region of the semiconductor film 134. Furthermore, a line width of the sub-wiring section 46 is slightly smaller than a line width of the main wiring section 45. According to the present embodiment, in comparison to the case in which the common wiring lines 31 includes only a portion of the third metal film 138 as in the first embodiment described above (see FIG. 4), the wiring resistance of the common wiring line 131 can be reduced and the redundancy of the common wiring line 131 can be improved as much as the sub-wiring section 46 including the low-resistance region of the semiconductor film 134 is connected to the main wiring section 45. As a result, the resistance distribution of a common electrode 125 can be reduced. Further, since the sub-wiring section 46 is made of a portion different from the channel region of the semiconductor film 134 constituting the channel region of the TFT, it is preferable for reducing the number of metal films.

Figure 15:
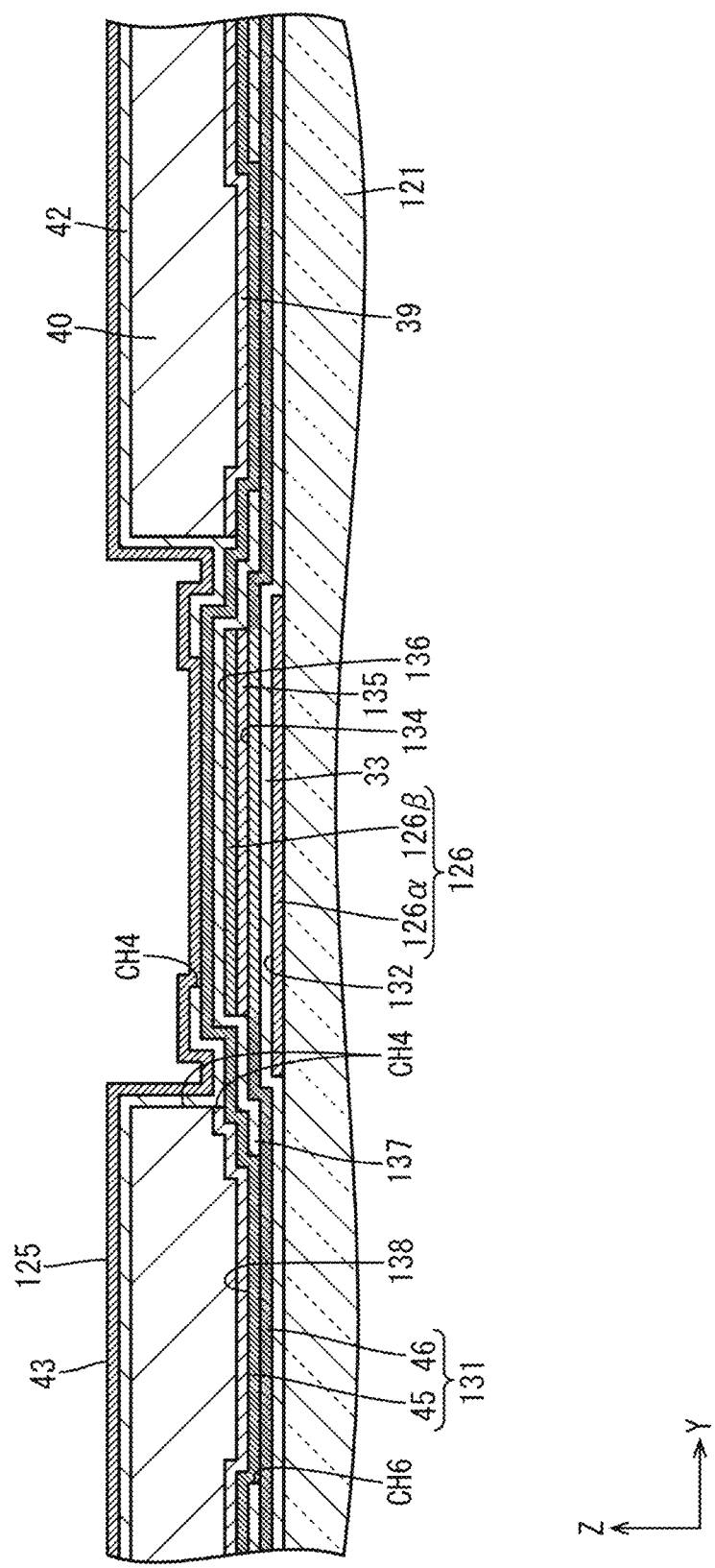
FIG. 15 is a cross-sectional view of the array substrate along the line G-G of FIG. 13.

FIG. 15 is a cross-sectional view of the array substrate 121 cut at or near a connection spot between the main wiring section 45 and the sub-wiring section 46. As illustrated in FIG. 15, the first interlayer insulating film 137 is interposed between the main wiring section 45 formed of the third metal film 138 and the sub-wiring section 46 formed of the semiconductor film 134. The main wiring section 45 and the sub-wiring section 46 are connected through wiring section contact holes CH6 that are formed in the first interlayer insulating film 137 interposed therebetween. The wiring section contact holes CH6 are disposed at two positions in the Y axis direction at which a gate wiring line 126 is sandwiched and are disposed not to overlap the gate wiring line 126. Accordingly, the main wiring section 45 and the sub-wiring section 46 are respectively connected through the wiring section contact holes CH6 at the two positions across the gate wiring line 126. Furthermore, common wiring line contact holes CH4 for connecting the main wiring section 45 and the common electrode 125 are positioned in the middle of the above-described two wiring section contact holes CH6 in the Y axis direction and thus are arranged to overlap the gate wiring line 126.

Incidentally, at the intersection of the gate wiring line 126 and the common wiring line 131, the sub-wiring section 46 formed from the semiconductor film 134 is disposed between the first gate wiring line 126α formed of the first metal film 132 and the second gate wiring line 126β formed of the second metal film 136 in the Z axis direction, as illustrated in FIG. 15. The most portion of the sub-wiring section 46 is composed of a low-resistance region produced by the low-resistance processing being performed on the semiconductor film 134 in the manufacturing process, but a portion thereof is a non-low resistance region. The reason is that a portion of the sub-wiring section 46 that overlaps with the second gate wiring line 126β including the second metal film 136 is masked by the second gate wiring line 126β during the low-resistance process. Therefore, the portion of the sub-wiring section 46 overlapping the second gate wiring line 126β locally has a high wiring resistance. In that regard, since the wiring section contact holes CH6 connecting the main wiring section 45 and the sub-wiring section 46 are disposed at two positions at which the gate wiring line 126 is sandwiched in the Y axis direction, that is, two positions at which a portion of the sub-wiring section 46 overlapping the second gate wiring line 126β is sandwiched, a portion of the sub-wiring section 46 serving as a non-low resistance region is bypassed by the main wiring section 45. This makes it difficult to increase the wiring resistance of the common wiring line 131 even when the sub-wiring section 46 does not have low resistance locally.

According to the above-described present embodiment, a TFT that is connected to at least a pixel electrode 124 and a source wiring line and that includes at least a channel region formed of a portion of the semiconductor film 134 is provided, and the common wiring line 131 includes: the main wiring section 45 formed of a portion of the same third metal film 138 as the source wiring line; and the sub-wiring section 46 that is disposed to overlap the main wiring section 45, connected to the main wiring section 45, and formed of the semiconductor film 134 formed having low resistance at a portion different from the channel region. In this manner, the common wiring line 131 has a configuration in which the sub-wiring section 46 formed by lowering resistance at the portion of the semiconductor film 134 constituting the channel region of the TFT, the portion being different from the channel region, is connected to the main wiring section 45 formed of the portion of the same third metal film 138 as the source wiring line. In comparison to a case in which the common wiring line is composed only of the main wiring section 45, the wiring resistance of the common wiring line 131 can be lowered, and the redundancy of the common wiring line 131 can be improved as much as the sub-wiring section 46 is connected to the main wiring section 45. As a result, the resistance distribution of the common electrode 125 can be reduced. Further, since the sub-wiring section 46 is made of the portion different from the channel region of the semiconductor film 134 constituting the channel region of the TFT, it is preferable for reducing the number of metal films (conductive films).

In addition, the TFT includes: at least a second gate electrode (gate electrode) disposed to overlap the channel region on the upper layer side with a second gate insulating film (gate insulating film) 135 therebetween; and the gate wiring line 126 that is disposed adjacent to the pixel electrode 124 in the short side direction, that extends in the long side direction, that includes a portion formed of a portion of the same second metal film (conductive film) 136 as the second gate electrode, and that is continuous with the second gate electrode, and the common wiring line 131 is arranged such that the main wiring section 45 and the sub-wiring section 46 overlap each other with the first interlayer insulating film (insulating film) 137 interposed between the main wiring section 45 and the sub-wiring section 46 and are connected through the wiring section contact holes CH6 that are formed at at least two positions, at which the gate wiring line 126 is sandwiched in the short side direction, in the first interlayer insulating film 137 interposed therebetween. In this way, when a scanning signal transmitted to the gate wiring line 126 is supplied to the second gate electrode, the TFT is driven, and an image signal transmitted to the source wiring line is accordingly supplied to the pixel electrode 124 via the channel region. The pixel electrode 124 is charged to an electric potential based on the image signal transmitted to the source wiring line. By connecting the main wiring section 45 and the sub-wiring section 46 constituting the common wiring line 131 through the wiring section contact holes CH6 that are formed in the first interlayer insulating film 137 interposed between the main wiring section 45 and the sub-wiring section 46, lower wiring resistance and improvement in redundancy of the common wiring line 131 can be achieved. Here, while a portion of the semiconductor film 134 has low resistance due to a low-resistance processing performed in the manufacturing process, the semiconductor film 134 is not reduced in resistance because it is masked by the second gate electrode that overlaps the channel region of the TFT on the upper layer side via the second gate insulating film 135. As a result, the portion of the sub-wiring section 46 formed of the portion of the semiconductor film 134 constituting the channel region, the portion being different from the channel region, overlaps the gate wiring line 126 including a portion formed of a portion of the same second metal film 136 as the second gate electrode and thus has no low resistance, and wiring resistance is locally increased. In that regard, since the main wiring section 45 and the sub-wiring section 46 are connected through wiring section contact holes CH6 that are formed at at least two positions, at which the gate wiring line 126 is sandwiched in the short side direction of the pixel electrode 124, in the first interlayer insulating film 137 interposed therebetween, the portion of the sub-wiring section 46 overlapping the gate wiring line 126 without low resistance is bypassed by the main wiring section 45. This makes it difficult to increase the wiring resistance of the common wiring line 131 even when the sub-wiring section 46 does not have low resistance locally.

Third Embodiment

A third embodiment of the present invention will be described with reference to FIG. 16 to FIG. 18. In the third embodiment, a configuration at or near spacer parts 230 on an array substrate 221 modified from that of the first embodiment will be introduced. Note that overlapping description of structures, actions, and effects similar to those of the first embodiment described above will be omitted.

Figure 16:
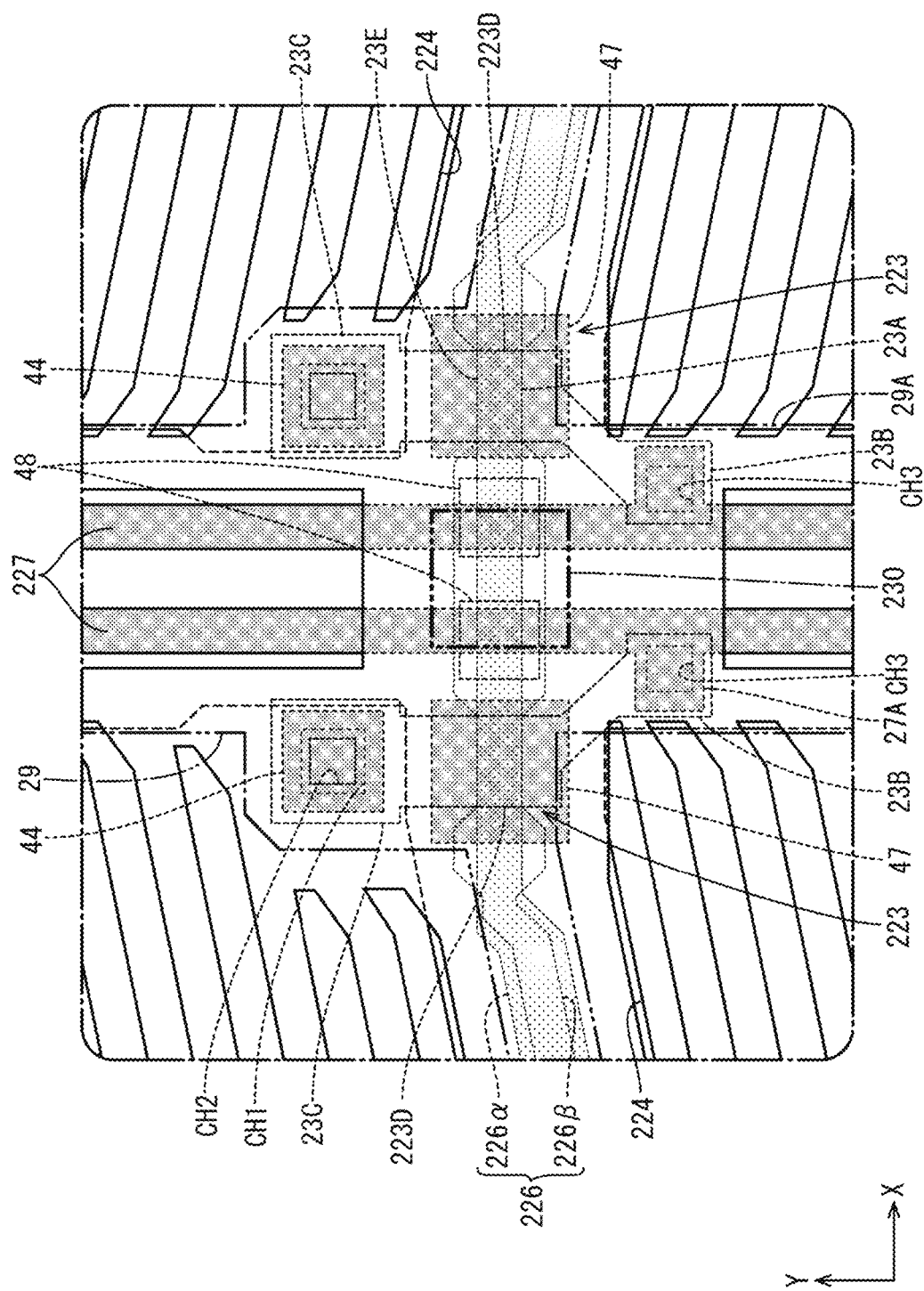
FIG. 16 is a plan view illustrating a pattern of a first metal film and a third metal film provided on an array substrate constituting a liquid crystal panel according to a third embodiment of the present invention.
Figure 17:
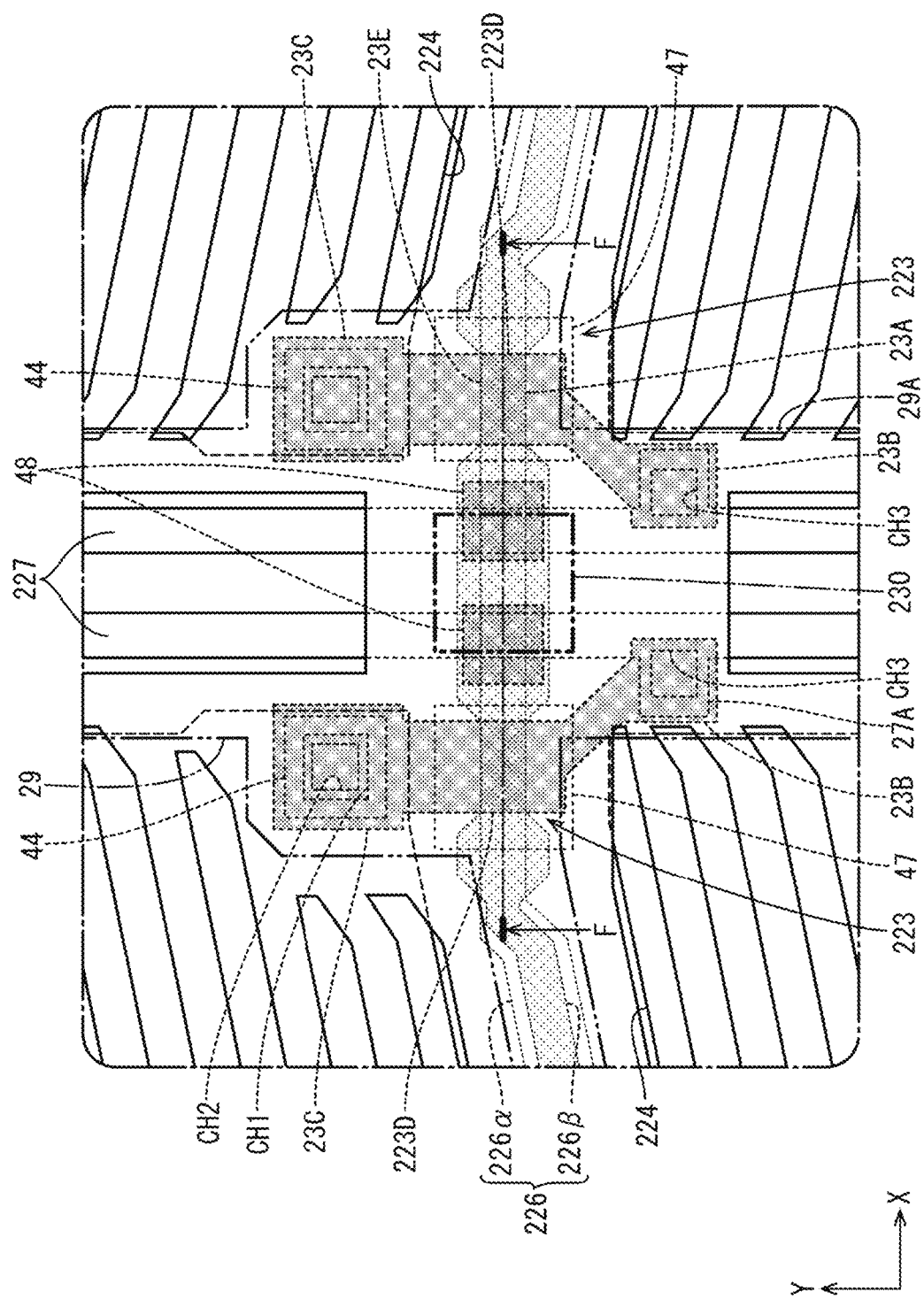
FIG. 17 is a plan view illustrating a pattern of a semiconductor film and a second metal film provided on the array substrate.

As illustrated in FIG. 16 and FIG. 17, the array substrate 221 according to the present embodiment includes: channel region overlapping portions 47 each formed of a portion of a third metal film 238 and disposed to overlap a channel region 223D; and source wiring line overlapping portions (image wiring line overlapping portion) 48 each formed of a portion of the semiconductor film 234 and disposed to overlap a source wiring line 227. FIG. 16 is a plan view illustrating a pattern of a first metal film 232 and the third metal film 238 provided on the array substrate 221. In FIG. 16, the first metal film 232 and the third metal film 238 are illustrated in shaded area. FIG. 17 is a plan view illustrating a pattern of the semiconductor film 234 and a second metal film 236 provided on the array substrate 221. In FIG. 17, the semiconductor film 234 and the second metal film 236 are illustrated in shaded area.

As illustrated in FIG. 16, the channel region overlapping portion 47 is formed of a portion of the same third metal film 238 as the source wiring line 227 and is disposed on the same straight line on which the spacer part 230 is located in the X axis direction. The channel region overlapping portion 47 has a rectangular shape in a plan view and is equivalent in size to the spacer part 230 in a plan view. The two channel region overlapping portions 47 are disposed adjacent to each other at an interval with respect to two source wiring lines 227 in the X axis direction. As illustrated in FIG. 17, the source wiring line overlapping portions 48 are formed of a portion of the semiconductor film 234 that is different from the channel region 223D and are disposed on the same straight line on which the spacer part 230, the channel region 223D, and the channel region overlapping portion 47 are located in the X axis direction. The source wiring line overlapping portion 48 has a rectangular shape in a plan view and has a smaller size than the spacer part 230 in a plan view. The two source wiring line overlapping portions 48 are arranged to individually overlap two source wiring lines 227.

Figure 18:
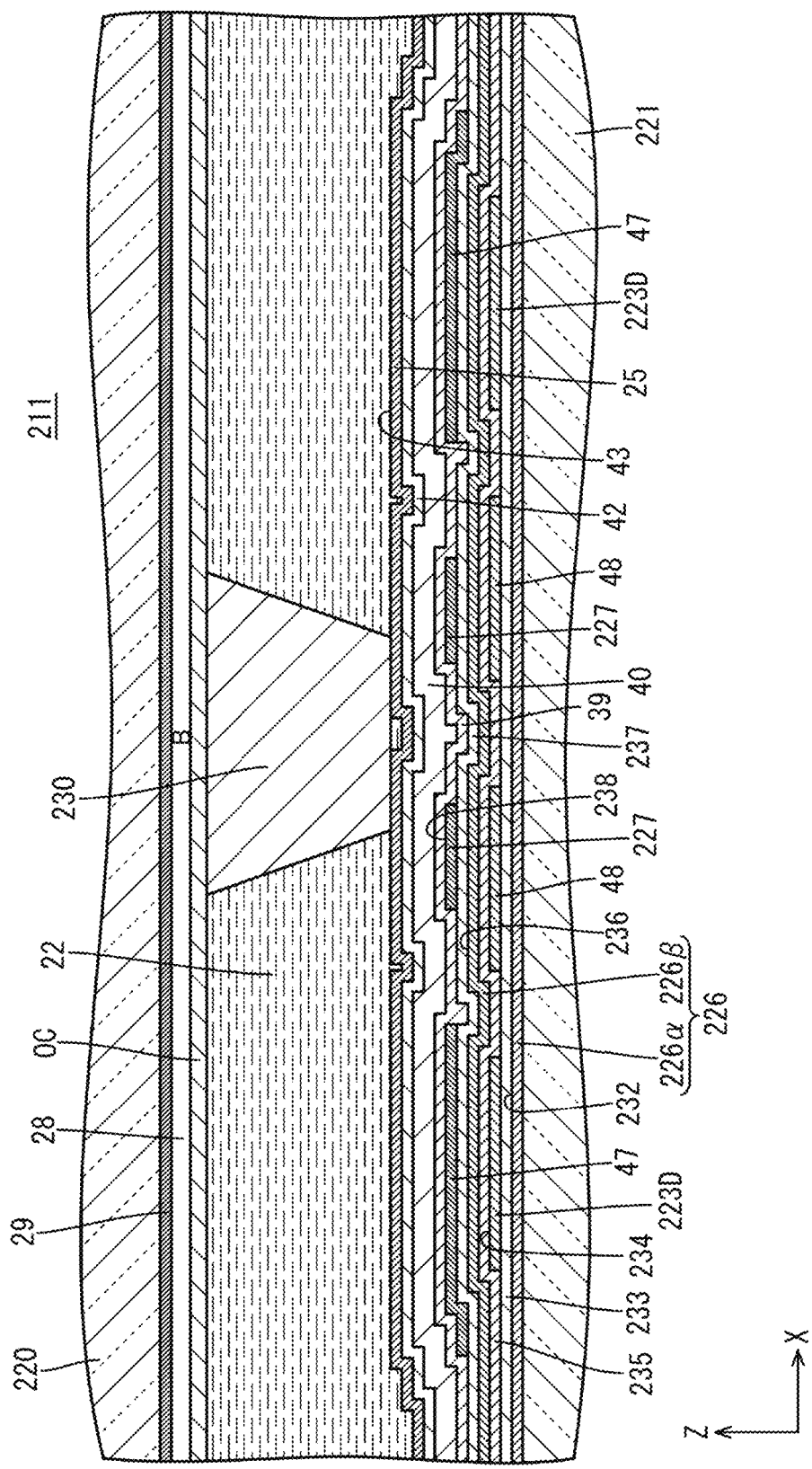
FIG. 18 is a cross-sectional view of the array substrate along the line F-F of FIG. 17.

FIG. 18 is a cross-sectional view of a liquid crystal panel 211 at or near the spacer part 230. As illustrated in FIG. 18, the channel region overlapping portions 47 are arranged to overlap a gate wiring line 226 in addition to the channel regions 223D. Thus, a first gate wiring line 226α formed of the first metal film 232; the channel regions 223D formed of the semiconductor film 234; and a second gate wiring line 226β formed of the second metal film 236 are layered on the lower layer side of the channel region overlapping portion 47 formed of the third metal film 238, and each of insulating films 233, 235, and 237 are layered. On the other hand, the source wiring line overlapping portions 48 are arranged to overlap the gate wiring line 226 in addition to the source wiring lines 227. The source wiring line overlapping portions 48 formed of a portion of the semiconductor film 234 are disposed to overlap the second gate wiring line 226β formed of the second metal film 236 and are masked by the second gate wiring line 226β during the low-resistance processing, and thus the entire portion thereof becomes a non-low resistance region. Therefore, the first gate wiring line 226α formed of the first metal film 232; the source wiring line overlapping portions 48 formed of the semiconductor film 234; and the second gate wiring line 226β formed of the second metal film 236 are layered on the lower layer side of the source wiring lines 227 formed of the third metal film 238, and each of the insulating films 233, 235, and 237 is layered. According to the configuration described above, the number of layers of the various films is the same at the positions of the array substrate 221 overlapping the two source wiring lines 227 and at the positions overlapping the two channel regions 223D adjacent to the source wiring lines 227. As a result, even if there is a difference in film thickness between the third metal film 238 of the source wiring line 227 and the semiconductor film 234, a height of a surface of the array substrate 221 facing the CF substrate 220 can be easily set at the position overlapping the channel region 223D and at the position overlapping the source wiring line 227. Accordingly, when the liquid crystal panel 211 is curved around the axis of curvature CAX, even in a case in which the spacer parts 230 come into contact with the array substrate 221 such that the spacer parts 230 overlap any of the channel regions 223D and the source wiring lines 227 attributable to the misalignment of the spacer parts 230 in the curve direction, the substrate interval maintenance function of the spacer parts 230 can be appropriately exhibited.

According to the above-described present embodiment, a TFT 223 that is connected to at least the pixel electrode 224 and the source wiring line 227 and that includes at least the channel region 223D formed of a portion of the semiconductor film 234; the channel region overlapping portion 47 that is formed of a portion of the same third metal film (conductive film) 238 as the source wiring line 227 and that is disposed on the same straight line on which the spacer part 230 is located in the long side direction and disposed to overlap the channel region 223D; and the source wiring line overlapping portion (image wiring line overlapping portion) 48 that is formed of a portion different from the channel region 223D of the semiconductor film 234 and that is disposed on the same straight line on which the spacer part 230 is located in the long side direction and disposed to overlap the source wiring line 227 are provided. Normally, the spacer parts 230 come into contact with the array substrate 221 at each position overlapping at least one of the two source wiring lines 227. On the other hand, in a case that the positions of the spacer parts 230 in contact with the array substrate 221 vary in the curve direction, that is, the long side direction of the pixel electrodes 224, the spacer parts 230 can be arranged to overlap the channel regions 223D of the TFT 223. In addition, while the channel region overlapping portions 47 formed of a portion of the same third metal film 238 as the source wiring lines 227 are disposed to overlap the channel regions 223D formed of the semiconductor film 234, the source wiring line overlapping portions 48 formed of a portion of the semiconductor film 234 constituting the channel regions 223D, the portion being different from the channel regions 223D, are disposed to overlap the source wiring lines 227, and thus, even if there is a difference in film thickness between the third metal film 238 of the source wiring lines 227 and the semiconductor film 234, the height of the surface of the array substrate 221 facing the CF substrate 220 can be easily set at the positions overlapping the channel regions 223D and at the positions overlapping the source wiring lines 227. Thus, even in a case in which the spacer parts 230 come into contact with the array substrate 221 such that the spacer parts 230 overlap any of the channel regions 223D and the source wiring lines 227, the substrate interval maintenance function of the spacer parts 230 can be appropriately exhibited.

Other Embodiments

The present invention is not limited to the embodiments described above and illustrated by the drawings, and embodiments such as those described below are also included within the technical scope of the present invention.

(1) Although the case in which the gate wiring lines have a two-layer structure composed of the first gate wiring line and the second gate wiring line has been described in each embodiment described above, the gate wiring lines may have a single-layer structure. In this case, the gate wiring lines having a single-layer structure can be formed of the first metal film, the gate wiring lines can be formed of the second metal film as well. In any event, although the TFTs can have a double gate structure, the TFTs can also have a single gate structure. In a case in which the TFTs have a double gate structure, the second gate electrodes having an island-shape and being formed of the second metal film or the first metal film may be disposed in an overlapping manner and electrically connected to the gate electrodes, which are continuous with the gate wiring lines formed of the first metal film or the second metal film.

(2) In a case in which the TFTs have a single gate structure using the gate wiring lines with a single layer structure as described in (1) above, the TFTs can be a top-gate type or a bottom-gate type. In configuration of the TFTs in a top-gate type single gate structure, in a case in which the gate wiring lines are composed of the second metal film, the gate electrodes may be composed of a portion of the gate wiring lines. In this case, although it is preferable that a light blocking portion formed of the first metal film be disposed on the lower layer side of the channel region in an overlapping manner, the embodiment is not necessarily limited thereto. Conversely, in configuration of the TFTs in a top-gate type single gate structure, it is also possible for the gate wiring lines to be composed of the first metal film In this case, the gate electrodes formed of the second metal film may be connected to the gate wiring lines formed of the first metal film. On the other hand, in configuration of the TFTs in a bottom-gate type single gate structure, it is also possible for the gate wiring lines to be composed of the first metal film In this case, the gate electrodes may be composed of a portion of the gate wiring lines. In addition, in configuration of the TFTs in the bottom-gate type single gate structure, it is also possible for the gate wiring lines to be composed of the second metal film In this case, the gate electrodes formed of the first metal film may be connected to the gate wiring lines formed of the second metal film.

(3) In addition to each of the embodiments described above, the specific line width size relationship, overlapping range, wiring path, and the like of the first gate wiring lines and the second gate wiring lines constituting the gate wiring lines can be changed as appropriate.

(4) In addition to each of the embodiments described above, the specific planar disposition, number installed, and the like of gate wiring line contact holes connecting the first gate wiring lines and the second gate wiring lines constituting the gate wiring lines can be changed as appropriate.

(5) In addition to each of the embodiments described above, the specific planar disposition, number installed, and the like of common wiring line contact holes connecting the common electrodes and the common wiring lines can be changed as appropriate.

(6) In addition to each of the embodiments described above, the specific planar disposition, number installed, size thereof in a plan view, and the like of spacer parts can be changed as appropriate. For example, the spacer parts may be disposed at positions not overlapping the gate wiring lines.

(7) Although the case in which two wiring section contact holes connecting the main wiring section and the sub-wiring section constituting the common wiring lines are provided with the gate wiring line sandwiched therebetween has been described in the second embodiment described above, three or more wiring section contact holes may be provided with the gate wiring line sandwiched therebetween.

(8) In addition to the third embodiment described above, the specific planar shape, planar disposition, size in a plan view, and the like of the channel region overlapping portion and the source wiring line overlapping portion can be changed as appropriate.

(9) In addition to each of the embodiments described above, the specific planar shape of the pixel electrodes can be changed as appropriate. For example, the pixel electrodes may have a bent planar shape to have a plurality of bent portions. In addition, a planar shape of the pixel electrodes having one bent portion may be different from that illustrated in each of the drawings, and for example, the bent portions may be disposed at positions other than the center position of the pixel electrodes in the long side direction. In addition, the pixel electrodes may have a shape without a bent portion (for example, a rectangular shape or the like). In addition, the pixel electrodes may have a planar shape (such as a square) that is not a long shape.

(10) Although only one flexible substrate is mounted on the array substrate in each of the embodiments described above, a configuration in which a plurality of flexible substrates are mounted on the array substrate may be used.

(11) Although the case in which the flexible substrate with the source driver mounted by means of COF is mounted on the array substrate by means of COB has been described in each of the embodiments described above, a configuration in which the source driver is mounted on the array substrate by means of Chip-On-Glass (COG) may be used. In this case, the source driver is mounted at a position on the display region side of the array substrate, rather than the region in which the flexible substrate is mounted.

(12) Although the case in which two gate drivers are mounted on the array substrate by means of COG has been described in each of the embodiments described above, instead of the gate driver, a gate circuit part may be provided in a monolithic manner on the array substrate using various types of films such as semiconductor films provided on the array substrate. In addition, only one gate driver or gate circuit part may be provided on the array substrate.

(13) In addition to each of the embodiments described above, the specific planar shape of the pixel overlap opening provided in the common electrode can be changed as appropriate. The planar shape of the pixel overlap opening can be, for example, a W shape, a straight line shape, or the like. Moreover, the specific number installed, arrangement pitch, and the like of pixel overlap openings can also be changed as appropriate.

(14) Although the case in which a pixel overlap opening is provided in a common electrode has been described in each of the embodiments described above, conversely, a common electrode overlap opening may be provided in a pixel electrode. In addition, it is also possible that the common electrode is formed of the first transparent electrode film and that the pixel electrode is formed of the second transparent electrode film.

(15) Although the case in which the proportion of the long side dimension to the short side dimension of the pixel electrode is 3 has been described in each of the embodiments described above, it is also possible to change the proportion of the long side dimension to the short side dimension of the pixel electrode to a value other than 3. For example, in a case that color filters arranged in the Y axis direction are of four colors (e.g., White in addition to R, G, and B), a proportion of the long side dimension to the short side dimension of the pixel electrode may be 4.

(16) In addition to each of the embodiments described above, the specific wiring path of the source wiring lines and the gate wiring lines can be changed as appropriate. Similarly, the specific wiring path of the common wiring lines can be changed as appropriate.

(17) Although the case in which the number of gate wiring lines installed is equal to the number of pixel electrodes arranged in the Y axis direction and in which the number of source wiring lines installed is equal to the number of pixel electrodes arranged in the X axis direction has been described in each of the embodiments described above, the number of gate wiring lines installed in the liquid crystal panel can be twice the number of pixel electrodes arranged in the Y axis direction, and the number of source wiring lines installed can be half the number of pixel electrodes arranged in the X axis direction.

(18) In addition to each of the embodiments described above, the specific arrangement pitch of the pixel parts in the liquid crystal panel can be changed as appropriate.

(19) Although a case in which the black matrix (inter-pixel light blocking portion) is provided on the CF substrate side has been described in each of the embodiments described above, the black matrix (inter-pixel light blocking portion) may be provided on the array substrate side.

(20) In addition to each of the embodiments described above, the semiconductor film constituting the channel region of the TFT may be polysilicon. In a case in which a single gate structure is adopted in this case, it is preferable to apply a bottom-gate type or a top-gate type including a light blocking portion in a lower layer of the channel region (the side on which a backlight device is installed) to the TFTs.

(21) In addition to each of the embodiments described above, a display mode of the liquid crystal panel may be a VA mode, a TN mode, an IPS mode, or the like.

(22) Although the liquid crystal panel without a built-in touch panel pattern that exhibits a position detection function has been described in each of the embodiments described above, an in-cell type liquid crystal panel with a built-in touch panel pattern that exhibits a position detection function may be used.

(23) Although the liquid crystal display device including a transmissive liquid crystal panel has been exemplified in each of the embodiments described above, a liquid crystal display device including a reflective liquid crystal panel or a semi-transmissive liquid crystal panel may be used.

(24) Although the case in which the planar shape of the liquid crystal display device (liquid crystal panel or backlight device) is horizontally long and one side part thereof on the long side has a shape curved in an arc shape in a plan view has been described in each of the embodiments described above, the specific planar shape of the liquid crystal display device can be changed as appropriate in other embodiments. A planar shape of the liquid crystal display device may be, for example, a horizontally long rectangle, a vertically long rectangle, a square, a circle, a semi-circle, a long circle, an oval, a trapezoid, a triangle, a polygon such as a pentagon or a polygon having more sides, or the like.

(25) Although a case in which the liquid crystal panel is curved in a manner that the center portion in the long side direction protrudes to the back side and both ends in the long side direction recede to the front side has been described in each of the embodiments described above, the liquid crystal panel may be curved in a manner that the center portion in the long side direction protrudes to the front side and both ends in the long side direction recede to the back side. In addition to this, the specific curved shape of the liquid crystal panel can be changed as appropriate. In addition, the liquid crystal panel may not be curved, and it may be used with the plate surface in a flat state.

REFERENCE SIGNS LIST 11, 211 Liquid crystal panel (display device)
20, 220 CF Substrate (second substrate)
21, 121, 221 Array substrate (first substrate)
23, 223 TFT (switching element)
23A First gate electrode
23B Source region
23C Drain region
23D, 223D Channel region
23E Second gate electrode (gate electrode)
24, 124, 224 Pixel electrode
25, 125 Common electrode
26, 126, 226 Gate wiring line (scanning wiring line)
26α, 126α, 226α First gate wiring line (first scanning wiring line)
26β, 126β, 226β Second gate wiring line (second scanning wiring line)
27, 227 Source wiring line (image wiring line)
30, 230 Spacer part
31, 131 Common wiring line
32, 132, 232 First metal film (conductive film)
33, 233 First gate insulating film
34, 134, 234 Semiconductor film
35, 135 Second gate insulating film (gate insulating film)
36, 136, 236 Second metal film (conductive film)
37, 137 First interlayer insulating film (insulating film)
38, 238 Third metal film (conductive film)
39 Second interlayer insulating film (insulating film)
40 Flattening film (insulating film)
42 Inter-electrode insulating film (insulating film)
45 Main wiring section
46 Sub-wiring section
47 Channel region overlapping portion
48 Source wiring line overlapping portion (image wiring line overlapping portion)
CAX Axis of curvature
CH4 Common wiring line contact hole
CH5 Gate wiring line contact hole
CH6 Wiring section contact hole

What is claimed is:

1. A display device comprising:
a plurality of pixel electrodes having a long shape and arranged in a long side direction of the plurality of pixel electrodes;
a common electrode overlapping the plurality of pixel electrodes with an insulating film interposed between the common electrode and the plurality of pixel electrodes;
a plurality of image wiring lines each extending in a short side direction of the plurality of pixel electrodes, arranged such that two of the image wiring lines are sandwiched between two pixel electrodes of the plurality of pixel electrodes adjacent to each other in the long side direction;
a scanning wiring line extending in the long side direction; and
a common wiring line extending in the short side direction, arranged such that one of the two pixel electrodes is sandwiched between the common wiring line and one of the two of the plurality of image wiring lines in the long side direction, connected to the common electrode, and including a portion formed of a same conductive film as a portion of each of the plurality of image wiring lines.

2. The display device according to claim 1, wherein:
the scanning wiring line is arranged adjacent to the plurality of pixel electrodes in the short side direction, and
the common wiring line and the common electrode are arranged to overlap each other with an insulating film interposed between the common wiring line and the common electrode and are connected through a common wiring line contact hole formed at a position in the insulating film overlapping the scanning wiring line.

3. The display device according to claim 1, wherein:
the scanning wiring line is arranged adjacent to the plurality of pixel electrodes in the short side direction,
the display device includes a switching element connected to a pixel electrode of the plurality of pixel electrodes, an image wiring line of the plurality of image wiring lines, and the scanning wiring line, and
the switching element includes a first gate electrode connected to the scanning wiring line, a channel region formed of a semiconductor film and arranged to overlap the first gate electrode on an upper layer side with a first gate insulating film interposed between the channel region and the first gate electrode, a second gate electrode arranged to overlap the channel region on the upper layer side with a second gate insulating film interposed between the second gate electrode and the channel region and connected to the first gate electrode, a source region connected to one end side portion of the channel region and each of the plurality of image wiring line, and a drain region connected to the other end side portion of the channel region and each of the plurality of pixel electrodes.

4. The display device according to claim 3, wherein the scanning wiring line includes a first scanning wiring line formed of a portion of the same conductive film as the first gate electrode and continuous with the first gate electrode and a second scanning wiring line formed of a portion of the same conductive film as the second gate electrode, continuous with the second gate electrode, and connected to the first scanning wiring line.

5. The display device according to claim 4, wherein the first scanning wiring line and the second scanning wiring line are arranged to at least partially overlap each other with an insulating film interposed between the first scanning wiring line and the second scanning wiring line.

6. The display device according to claim 5, wherein the first scanning wiring line and the second scanning wiring line are connected through a scanning wiring line contact hole formed in the insulating film interposed at an overlapping portion at which the first scanning wiring line and the second scanning wiring line overlap and at a position in the long side direction of the overlapping portion between pixel electrodes of the plurality of pixel electrodes adjacent to each other and sandwiching the common wiring line.

7. The display device according to claim 4, wherein, in comparison to the first scanning wiring line, while a portion of the second scanning wiring line adjacent to the plurality of pixel electrodes is narrower, a portion of the second scanning wiring line adjacent to the switching element is wider.

8. The display device according to claim 1, further comprising:
a switching element connected at least to one of the plurality of pixel electrodes and one of the plurality of image wiring lines and including at least a channel region formed of a portion of a semiconductor film, wherein
the common wiring line includes a main wiring section formed of a portion of the same conductive film as the image wiring line and a sub-wiring section arranged to overlap the main wiring section, connected to the main wiring section, and formed of a portion of the semiconductor film formed having low resistance at the portion different from the channel region.

9. The display device according to claim 8, wherein:
the switching element includes at least a gate electrode arranged to overlap the channel region on an upper layer side with a gate insulating film interposed between the channel region and the gate electrode, and
the scanning wiring line is arranged adjacent to the plurality of pixel electrodes in the short side direction, extending in the long side direction, including a portion formed of a same conductive film as a portion of the gate electrode, and continuous with the gate electrode, and
the common wiring line is arranged such that the main wiring section and the sub-wiring section overlap each other with an insulating film interposed between the main wiring section and the sub-wiring section and are connected through wiring section contact holes formed in the insulating film interposed at at least two positions at which the scanning wiring line is sandwiched in the short side direction.

10. The display device according to claim 1, further comprising:
a first substrate provided with at least the plurality of pixel electrodes, the common electrode, the plurality of image wiring line, and the common wiring line;
a second substrate arranged to face the first substrate with an interval between the first substrate and the second substrate; and
a spacer part provided on the second substrate and maintaining an interval with the first substrate by being interposed between the first substrate and the second substrate, wherein
the spacer part is arranged such that the spacer part overlaps at least one of two of the plurality of image wiring lines sandwiched between two of the plurality of pixel electrodes adjacent to each other in the long side direction.

11. The display device according to claim 10, wherein the first substrate and the second substrate are formed such that a plate surface of the first substrate and the second substrate curves around at least one axis of curvature and a curve direction thereof coincides with the long side direction.

12. The display device according to claim 10, wherein:
the scanning wiring line is arranged adjacent to the plurality of pixel electrodes in the short side direction and extends in the long side direction, and
the spacer part is arranged to overlap the scanning wiring line.

13. The display device according to claim 10, further comprising:
a switching element connected at least to one of the plurality of pixel electrodes and one of the plurality of image wiring lines and including at least a channel region formed of a portion of a semiconductor film;
a channel region overlapping portion formed of a same conductive film as a portion of each of the plurality of image wiring line, arranged on the same straight line on which the spacer part is located in the long side direction, and arranged to overlap the channel region; and
an image wiring line overlapping portion formed of a portion of the semiconductor film different from the channel region, arranged on the same straight line on which the spacer part is located in the long side direction, and arranged to overlap the plurality of image wiring lines.

14. A display device comprising:
a plurality of pixel electrodes having a long shape and arranged in a long side direction of the plurality of pixel electrodes;

a common electrode overlapping the plurality of pixel electrodes with an insulating film interposed between the common electrode and the plurality of pixel electrodes;

a plurality of image wiring lines each extending in a short side direction of the plurality of pixel electrodes, arranged such that two of the image wiring lines are sandwiched between two pixel electrodes of the plurality of pixel electrodes adjacent to each other in the long side direction, and supplying an image signal to each of the two pixel electrodes adjacent to each other in the long side direction;

a common wiring line extending in the short side direction, arranged such that one of the two pixel electrodes is sandwiched between the common wiring line and one of the two of the plurality of image wiring lines in the long side direction, connected to the common electrode, and including a portion formed of a same conductive film as a portion of each of the plurality of image wiring lines;

a scanning wiring line arranged adjacent to the plurality of pixel electrodes in the short side direction and extending in the long side direction; and a switching element connected to a pixel electrode of the plurality of pixel electrodes, an image wiring line of the plurality of image wiring lines, and the scanning wiring line, wherein the switching element includes:
- a first gate electrode connected to the scanning wiring line,
- a channel region formed of a semiconductor film and arranged to overlap the first gate electrode on an upper layer side with a first gate insulating film interposed between the channel region and the first gate electrode,
- a second gate electrode arranged to overlap the channel region on the upper layer side with a second gate insulating film interposed between the second gate electrode and the channel region and connected to the first gate electrode,
- a source region connected to one end side portion of the channel region and each of the plurality of image wiring lines, and
- a drain region connected to the other end side portion of the channel region and each of the plurality of pixel electrodes.

15. A display device comprising:

a plurality of pixel electrodes having a long shape and arranged in a long side direction of the plurality of pixel electrodes;

a common electrode overlapping the plurality of pixel electrodes with an insulating film interposed between the common electrode and the plurality of pixel electrodes;

a plurality of image wiring lines each extending in a short side direction of the plurality of pixel electrodes, arranged such that two of the image wiring lines are sandwiched between two pixel electrodes of the plurality of pixel electrodes adjacent to each other in the long side direction, and supplying an image signal to each of the two pixel electrodes adjacent to each other in the long side direction;

a common wiring line extending in the short side direction, arranged such that one of the two pixel electrodes is sandwiched between the common wiring line and one of the two of the plurality of image wiring lines in the long side direction, connected to the common electrode, and including a portion formed of a same conductive film as a portion of each of the plurality of image wiring lines;

a first substrate provided with at least the plurality of pixel electrodes, the common electrode, the plurality of image wiring lines, and the common wiring line;

a second substrate arranged to face the first substrate with an interval between the first substrate and the second substrate; and a spacer part provided on the second substrate and maintaining an interval with the first substrate by being interposed between the first substrate and the second substrate, wherein the spacer part is arranged such that the spacer part overlaps at least one of two of the plurality of image wiring lines sandwiched between two of the plurality of pixel electrodes adjacent to each other in the long side direction.

* * * * *